US011658234B2

(12) United States Patent
Bothe et al.

(10) Patent No.: US 11,658,234 B2
(45) Date of Patent: May 23, 2023

(54) FIELD EFFECT TRANSISTOR WITH ENHANCED RELIABILITY

(71) Applicant: Wolfspeed, Inc., Durham, NC (US)

(72) Inventors: Kyle Bothe, Cary, NC (US); Terry Alcorn, Cary, NC (US); Dan Namishia, Wake Forest, NC (US); Jia Guo, Apex, NC (US); Matt King, Wake Forest, NC (US); Saptharishi Sriram, Cary, NC (US); Jeremy Fisher, Raleigh, NC (US); Fabian Radulescu, Chapel Hill, NC (US); Scott Sheppard, Chapel Hill, NC (US); Yueying Liu, Cary, NC (US)

(73) Assignee: Wolfspeed, Inc., Durham, NC (US)

( * ) Notice: Subject to any disclaimer, the term of this patent is extended or adjusted under 35 U.S.C. 154(b) by 24 days.

(21) Appl. No.: 17/325,576

(22) Filed: May 20, 2021

(65) Prior Publication Data

US 2022/0130985 A1  Apr. 28, 2022

Related U.S. Application Data

(63) Continuation-in-part of application No. 17/081,476, filed on Oct. 27, 2020, now Pat. No. 11,502,178.

(51) Int. Cl.
*H01L 29/778* (2006.01)
*H01L 29/66* (2006.01)
*H01L 29/40* (2006.01)

(52) U.S. Cl.
CPC ........ *H01L 29/7786* (2013.01); *H01L 29/402* (2013.01); *H01L 29/66462* (2013.01)

(58) Field of Classification Search
CPC .......... H01L 29/7786; H01L 29/66462; H01L 29/402
See application file for complete search history.

(56) References Cited

U.S. PATENT DOCUMENTS

| 6,849,882 B2 | 2/2005 | Chavarkar et al. |
| 7,126,426 B2 | 10/2006 | Mishra et al. |

(Continued)

FOREIGN PATENT DOCUMENTS

| CN | 108565283 A | * | 9/2018 |
| KR | 20080108486 A | * | 12/2008 |

OTHER PUBLICATIONS

International Search Report and Written Opinion of the International Searching Authority, PCT/US2022/030233, dated Sep. 2, 2022, 10 pages.

*Primary Examiner* — Joseph C. Nicely
(74) *Attorney, Agent, or Firm* — Sage Patent Group

(57) ABSTRACT

A transistor device includes a semiconductor epitaxial layer structure including a channel layer and a barrier layer on the channel layer, a source contact and a drain contact on the barrier layer, an insulating layer on the semiconductor layer between the source contact and the drain contact, and a gate contact on the insulating layer. The gate contact includes a central portion that extends through the insulating layer and contacts the barrier layer and a drain side wing that extends laterally from the central portion of the gate toward the drain contact by a distance $\Gamma_D$. The drain side wing of the gate contact is spaced apart from the barrier layer by a distance d1 that is equal to a thickness of the insulating layer. The distance $\Gamma_D$ is less than about 0.3 μm, and the distance d1 is less than about 80 nm.

24 Claims, 17 Drawing Sheets

(56) References Cited

U.S. PATENT DOCUMENTS

| | | |
|---|---|---|
| 7,230,284 B2 | 6/2007 | Parikh et al. |
| 7,419,892 B2 | 9/2008 | Sheppard et al. |
| 7,501,669 B2 | 3/2009 | Parikh et al. |
| 7,550,783 B2 | 6/2009 | Wu et al. |
| 7,573,078 B2 | 8/2009 | Wu et al. |
| 7,875,537 B2 | 1/2011 | Suvorov et al. |
| 8,823,057 B2 | 9/2014 | Sheppard et al. |
| 9,318,594 B2 | 4/2016 | Sheppard et al. |
| 9,711,633 B2 | 7/2017 | Sheppard et al. |
| 9,847,411 B2 | 12/2017 | Sriram et al. |
| 9,984,881 B2 | 5/2018 | Sheppard et al. |
| 10,692,998 B2 | 6/2020 | Fayed et al. |
| 10,892,356 B2 | 1/2021 | Sriram et al. |
| 10,971,612 B2 | 4/2021 | Bothe et al. |
| 2005/0253167 A1* | 11/2005 | Wu ................... H01L 29/41725 257/E29.317 |
| 2006/0202272 A1* | 9/2006 | Wu ...................... H01L 29/404 257/E29.253 |
| 2008/0073670 A1* | 3/2008 | Yang ................... H01L 29/404 257/E29.253 |
| 2008/0128752 A1* | 6/2008 | Wu ................... H01L 29/42316 257/E29.127 |
| 2009/0230429 A1* | 9/2009 | Miyamoto ............ H01L 29/402 257/192 |
| 2010/0276698 A1 | 11/2010 | Moore et al. |
| 2011/0057232 A1* | 3/2011 | Sheppard ............ H01L 29/0843 257/E21.403 |
| 2012/0049973 A1 | 3/2012 | Smith, Jr. et al. |
| 2012/0194276 A1 | 8/2012 | Fisher |
| 2013/0134482 A1* | 5/2013 | Yu ........................ H01L 29/452 257/E21.407 |
| 2013/0193485 A1 | 8/2013 | Akiyama et al. |
| 2013/0228789 A1 | 9/2013 | Yamamura |
| 2014/0001478 A1* | 1/2014 | Saunier ............... H01L 29/7786 257/E21.403 |
| 2014/0361342 A1 | 12/2014 | Sriram et al. |
| 2020/0027956 A1 | 1/2020 | Aoki |
| 2020/0312968 A1 | 10/2020 | Kasahara et al. |
| 2020/0395475 A1* | 12/2020 | Bothe .................. H01L 29/2003 |
| 2021/0013314 A1 | 1/2021 | Hu et al. |
| 2022/0130965 A1 | 4/2022 | Bothe et al. |
| 2022/0302271 A1* | 9/2022 | Trang .................. H01L 29/0649 |
| 2022/0376085 A1 | 11/2022 | Bothe et al. |
| 2022/0376098 A1 | 11/2022 | Lee et al. |
| 2022/0376099 A1 | 11/2022 | Bothe et al. |
| 2022/0376104 A1 | 11/2022 | Bisges et al. |
| 2022/0376105 A1 | 11/2022 | Guo et al. |
| 2022/0376106 A1 | 11/2022 | Lee et al. |

* cited by examiner

FIELD EFFECT TRANSISTOR WITH ENHANCED RELIABILITY

CROSS-REFERENCE TO RELATED APPLICATIONS

The present application is a continuation-in-part of U.S. application Ser. No. 17/081,476, entitled "FIELD EFFECT TRANSISTOR WITH AT LEAST PARTIALLY RECESSED FIELD PLATE," filed Oct. 27, 2020, now U.S. Pat. No. 11,502,178, issued Nov. 15, 2022, the disclosure of which is incorporated herein by reference in its entirety.

BACKGROUND

The present disclosure relates to transistor structures and in particular to field effect transistors including field plates.

Narrow bandgap semiconductor materials, such as silicon (Si) and gallium arsenide (GaAs), are widely used in semiconductor devices for low power and, in the case of Si, low frequency applications. However, these semiconductor materials may not be well-suited for high power and/or high frequency applications, for example, due to their relatively small bandgaps (1.12 eV for Si and 1.42 for GaAs at room temperature) and relatively small breakdown voltages.

Interest in high power, high temperature and/or high frequency applications and devices has focused on wide bandgap semiconductor materials such as silicon carbide (3.2 eV for 4H—SiC at room temperature) and the Group III nitrides (e.g., 3.36 eV for GaN at room temperature). These materials may have higher electric field breakdown strengths and higher electron saturation velocities than GaAs and Si.

A device of particular interest for high power and/or high frequency applications is the High Electron Mobility Transistor (HEMT), which is also known as a modulation doped field effect transistor (MODFET). In a HEMT device, a two-dimensional electron gas (2DEG) may be formed at the heterojunction of two semiconductor materials with different bandgap energies, where the smaller bandgap material has a higher electron affinity than the wider bandgap material. The 2DEG is an accumulation layer in the undoped smaller bandgap material and can contain a relatively high sheet electron concentration, for example, in excess of $10^{13}$ carriers/cm$^2$. Additionally, electrons that originate in the wider bandgap semiconductor may transfer to the 2DEG, allowing a relatively high electron mobility due to reduced ionized impurity scattering. This combination of relatively high carrier concentration and carrier mobility can give the HEMT a relatively large transconductance and may provide a performance advantage over metal-semiconductor field effect transistors (MESFETS) for high-frequency applications.

HEMTs fabricated in the gallium nitride/aluminum gallium nitride (GaN/AlGaN) material system can generate large amounts of RF power due to a combination of material characteristics, such as relatively high breakdown fields, relatively wide bandgaps, relatively large conduction band offset, and/or relatively high saturated electron drift velocity. A major portion of the electrons in the 2DEG may be attributed to polarization in the AlGaN.

Field plates have been used to enhance the performance of GaN-based HEMTs at microwave frequencies and have exhibited performance improvement over devices without field plates. Many field plate approaches have involved a field plate connected to the source of the transistor with the field plate on top of the drain side of a channel. This can result in a reduction of the electric field on the gate-to-drain side of the transistor, thereby increasing breakdown voltage and reducing the high-field trapping effect. However, some transistors with gate-to-drain field plates can exhibit relatively poor reliability performance, particularly at class C (or higher class) operation where the electric field on the source side of the gate becomes significant.

FIG. 1 shows a GaN-based HEMT 10 formed on a silicon carbide substrate 12. A GaN channel layer 16 is on the substrate 12, and an AlGaN barrier layer 18 is on the channel layer 16. A two-dimensional electron gas (2DEG) 20 arises in the channel layer 16 adjacent the barrier layer 18. A source contact 22 and a drain contact 24 are formed on the channel layer 16. The conductivity of the 2DEG 20 is modulated by applying a voltage to a gate 26 that is formed on the barrier layer 18 between the source contact 22 and the drain contact 24. As shown in FIG. 1, the gate 26 may have a mushroom or T-top configuration in which the gate 26 contacts the barrier layer 18 in a relative narrow contact region that extends through a surface dielectric layer 25.

The HEMT 10 includes a field plate 28 that is connected to the source contact 22. The field plate 28 is spaced apart from the gate 26 by an interlayer dielectric layer 21, and is spaced apart from the barrier layer 18 by the interlayer dielectric layer 21 and the surface dielectric layer 25. The field plate 28 extends above the gate 26 and laterally toward the drain 24.

The field plate 28 is connected to the source contact 22. Connecting the field plate 28 to the source contact 22 provides a reduction in gate-to-drain capacitance (Cgd), which consequently can enhance the gain of the device. In addition to reducing gate-to-drain capacitance Cgd, the presence of the field plate 28 may improve linearity of the device and/or reduce the drain bias dependence of the capacitance. While GaN-based HEMTs generally display good linearity, further improvement may be desired for in high power RF applications. Moreover, while the structure shown in FIG. 1 can have a reduced gate-to-drain capacitance Cgd compared to structures without a field plate, the gate-to-drain capacitance Cgd can still show a large dependence on the bias of the drain contact 24.

SUMMARY

A transistor device according to some embodiments includes a semiconductor epitaxial layer structure including a channel layer and a barrier layer on the channel layer, a source contact and a drain contact on the barrier layer, a first insulating layer on the semiconductor layer between the source contact and the drain contact, and a gate contact on the first insulating layer. The gate contact includes a central portion that extends through the first insulating layer and contacts the barrier layer and a drain side wing that extends laterally from the central portion of the gate toward the drain contact by a distance $\Gamma_D$. The drain side wing of the gate contact is spaced apart from the barrier layer by a distance d1 that is equal to a thickness of the first insulating layer. The distance $\Gamma_D$ is less than about 0.3 µm, and the distance d1 is less than about 80 nm.

The distance $\Gamma_D$ may be between about 0.1 µm and 0.3 µm, and the distance d1 may be between about 60 nm and 80 nm. The distance $\Gamma_D$ may be about 0.2 µm and the distance d1 may be about 70 nm.

The barrier layer may include AlGaN with an aluminum concentration greater than 20% and a thickness of less than 25 nm.

A distance $L_{GS}$ between the central portion of the gate contact and the source contact may be between about 0.8 µm and 1.2 μm. A distance $L_{GD}$ between the central portion of the gate contact and the drain contact may be between about 3.2 μm and 3.8 μm.

The semiconductor epitaxial layer structure may be formed on a substrate, which may include silicon carbide and have a thickness of less than about 100 μm.

The gate contact may include a source side wing that extends laterally from the central portion of the gate toward the drain contact by a distance $\Gamma_S$ where $\Gamma_S$ may be less than about 0.3 μm. In some embodiments, $\Gamma_S$ may be less than $\Gamma_D$.

The transistor device may further include a field plate above the semiconductor epitaxial layer structure between the gate contact and the drain contact. The field plate may include a central portion that may be spaced apart from the barrier layer by a distance d2, where d2 may be less than 250 nm. In some embodiments, d2 may be between 190 nm and 230 nm.

The field plate may be laterally spaced apart from the gate contact by a distance TT-FP2, where TT-FP2 may be between about 0.3 μm and 0.5 μm.

The field plate may include a central field plate portion a source side field plate wing extending away from the central field plate portion toward the source contact and a drain side field plate wing extending away from the central field plate portion toward the source contact. The source side field plate wing and the drain side field plate wing may be spaced apart from the barrier layer by a distance d3 that may be between about 250 nm and 310 nm.

The central portion of the gate contact may have a width of about 200 nm to 300 nm at an interface with the barrier layer.

In some embodiments, the transistor device may exhibit an output power greater than 9 W/mm at an operating frequency of 10 GHz at a gate voltage of 50V while demonstrating a predicted lifetime greater than $10^6$ hours at a junction temperature of 225 C. In some embodiments, the transistor device may exhibit a peak power added efficiency (PAE) greater than 60% at a gate voltage of 50V while demonstrating a predicted lifetime greater than $10^6$ hours at a junction temperature of 225 C. In some embodiments, the transistor device may exhibit an associated gain greater than 12 dB at peak PAE. In some embodiments, the transistor device may have a cut-off frequency greater than 20 GHz at a gate voltage of 50V while demonstrating a predicted lifetime greater than $10^6$ hours at a junction temperature of 225 C. In some embodiments, the transistor device may have a cut-off frequency greater than 20 GHz at a gate voltage of 50V while demonstrating output power greater than 9 W/mm peak PAE greater than 60% and associated gain at peak PAE greater than 12 dB.

A method of forming a transistor device according to some embodiments includes forming a semiconductor epitaxial layer structure including a channel layer and a barrier layer on the channel layer the barrier layer has a higher bandgap than the channel layer, forming a source contact and a drain contact on the barrier layer, forming a first insulating layer on the semiconductor layer between the source contact and the drain contact, and forming a gate contact on the first insulating layer the gate contact including a central portion that extends through the first insulating layer and contacts the barrier layer and a drain side wing that extends laterally from the central portion of the gate toward the drain contact by a distance $\Gamma_D$. The drain side wing of the gate contact is spaced apart from the barrier layer by a distance d1 that is equal to a thickness of the first insulating layer. The distance $\Gamma_D$ is less than about 0.3 μm and the distance d1 is less than about 80 nm.

A transistor device according to some embodiments includes a semiconductor epitaxial layer structure including a channel layer and a barrier layer on the channel layer the barrier layer has a higher bandgap than the channel layer, a source contact and a drain contact on the barrier layer, a first insulating layer on the semiconductor layer between the source contact and the drain contact, and a gate contact on the first insulating layer the gate contact including a central portion that extends through the first insulating layer and contacts the barrier layer and a drain side wing that extends laterally from the central portion of the gate toward the drain contact. The transistor device exhibits an output power greater than 9 W/mm at an operating frequency of 10 GHz at a gate voltage of 50V while demonstrating a predicted lifetime greater than $10^6$ hours at a junction temperature of 225 C.

In some embodiments, the transistor device may exhibit a peak power added efficiency (PAE) greater than 60% at a gate voltage of 50V while demonstrating a predicted lifetime greater than $10^6$ hours at a junction temperature of 225 C. In some embodiments, the transistor device may exhibit an associated gain greater than 12 dB at peak PAE. In some embodiments, the transistor device may have a cut-off frequency greater than 20 GHz at a gate voltage of 50V while demonstrating a predicted lifetime greater than $10^6$ hours at a junction temperature of 225 C. In some embodiments, the transistor device may have a cut-off frequency greater than 20 GHz at a gate voltage of 50V while demonstrating output power greater than 9 W/mm peak PAE greater than 60% and associated gain at peak PAE greater than 12 dB.

DETAILED DESCRIPTION OF EMBODIMENTS

Figure 1:
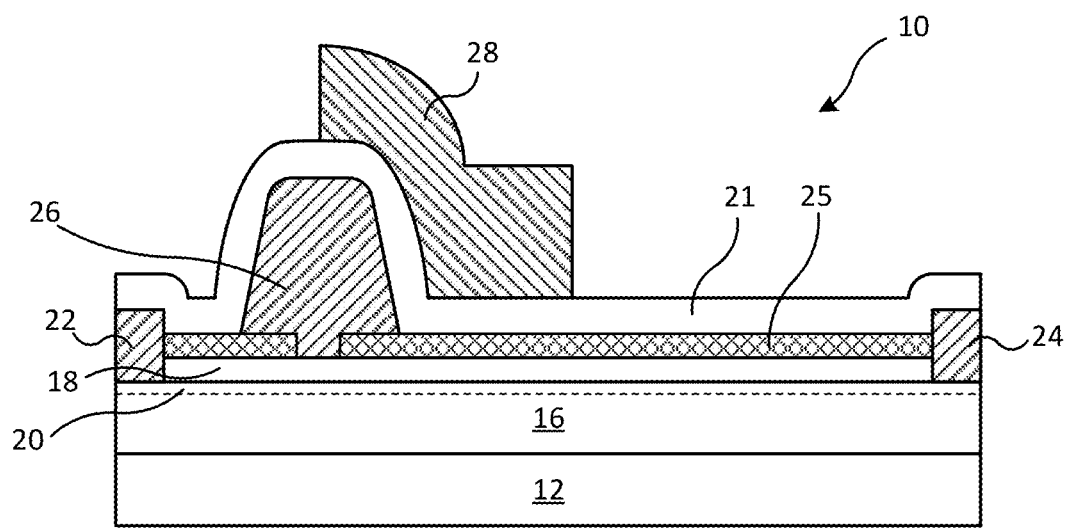
FIG. 1 is a cross-sectional view of a conventional transistor device including a field plate.

Embodiments of the inventive concepts will now be described in connection with the accompanying drawings.

Some embodiments described herein provide a transistor device including a field plate that is self-aligned the gate, and in some embodiments that is laterally spaced apart from the gate, such that the field plate does not overlap the gate in the vertical direction. In some embodiments, the field plate is recessed toward the barrier layer in a recess region. In still further embodiments, the field plate may be connected to the source outside an active area of the device by means of a connection that does not cross over the gate of the device.

It is also understood that, although the ordinal terms first, second, third, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Furthermore, relative terms, such as "lower" or "bottom" and "upper" or "top," may be used herein to describe the relationship of one element to another as illustrated in the drawings. It is understood that relative terms are intended to encompass different orientations of the device in addition to the orientation depicted in the drawings. For example, if the device in one of the drawings is turned over, features described as being on the "lower" side of an element would then be oriented on "upper" side of that element. The exemplary term "lower" can therefore describe both lower and upper orientations, depending of the particular orientation of the device. Similarly, if the device in one of the drawings is turned over, elements described as "below" or "beneath" other elements would then be oriented above those other elements. The exemplary terms "below" or "beneath" can therefore describe both an orientation of above and below.

The terminology used in the description of the disclosure herein is for the purpose of describing particular embodiments only and is not intended to be limiting of the disclosure. As used in the description of the disclosure and the appended claims, the singular forms "an" and "the" are intended to include the plural forms as well, unless the context clearly indicates otherwise. It is also understood that the term "and/or" as used herein refers to and encompasses any and all possible combinations of one or more of the associated listed items. It will be further understood that the terms "comprises" and "comprising," when used in this specification, specify the presence of stated steps, operations, features, elements, and/or components, but do not preclude the presence or addition of one or more other steps, operations, features, elements, components, and/or groups thereof.

Embodiments of the disclosure are described herein with reference to cross-section illustrations that are schematic illustrations of idealized embodiments of the disclosure. As such, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing. The regions illustrated in the drawings are schematic in nature, and their shapes are not intended to illustrate the actual shape of a region of a device and are not intended to limit the scope of the disclosure unless explicitly stated otherwise. Further, lines that appear straight, horizontal, or vertical in the below drawings for schematic reasons will often be sloped, curved, non-horizontal, or non-vertical. Further, while the thicknesses of elements are meant to be schematic in nature.

Unless otherwise defined, all terms used in disclosing embodiments of the disclosure, including technical and scientific terms, have the same meaning as commonly understood by one of ordinary skill in the pertinent art and are not necessarily limited to the specific definitions known at the time of the present disclosure. Accordingly, these terms can include equivalent terms that are created after such time. It is further understood that terms, such as those defined in commonly used dictionaries, should be interpreted as having a meaning that is consistent with their meaning in the present specification and in the context of the relevant art.

Applications for GaN-based HEMTs include high frequency amplifiers for high frequency RF signal transmission (e.g., >1 GHz). Such amplifiers are found, for example, in transceivers of wireless communications systems such as 5G wireless communication systems, aerospace and defense communication systems, L-band and S-band radar communication systems, satellite communication systems up to Ku-band systems, and others. Accordingly, RF performance and reliability of the devices are key performance goals for the design of GaN-based HEMTs. RF performance is typically characterized in terms of output power at a given operating frequency, peak power added efficiency (PAE) at a given operating frequency, associated gain at a given operating frequency and transistor cut-off frequency. Reliability may be characterized using a high temperature reverse bias (HTRB) test, which evaluates long-term stability of the device under high drain-source bias. During an HTRB test, devices are stressed at or slightly less than the maximum rated reverse breakdown voltage at an ambient temperature close to their maximum junction temperature for a long period, such as 1,000 hours. An HTRB test combines electrical and thermal stress. Thus, the HTRB test can be used to check junction integrity as well as the integrity of edge termination structures and passivation structures in the device.

Some embodiments described herein are based on a discovery that certain design parameters of a GaN-based HEMT are strongly correlated with RF performance and/or device reliability in ways that were not previously appreciated. In particular, some embodiments are based on a discovery that by appropriate choice of certain design parameters, devices with both high reliability and high RF performance can be realized.

In some embodiments, GaN-based HEMT devices have been fabricated that exhibit output power greater than 9 W/mm at 10 GHz at a gate voltage of 50V while demonstrating a predicted lifetime greater than $10^6$ hours at a junction temperature of 225 C.

In some embodiments, GaN-based HEMT devices have been fabricated that exhibit peak PAE greater than 60% at a gate voltage of 50V while demonstrating a predicted lifetime greater than $10^6$ hours at a junction temperature of 225 C. In some embodiments, the devices exhibit an associated gain greater than 12 dB at peak PAE.

In some embodiments, GaN-based HEMT devices have been fabricated that have a cut-off frequency greater than 20 GHz at a gate voltage of 50V while demonstrating output power greater than 9 W/mm, peak PAE greater than 60% and associated gain at peak PAE greater than 12 dB a predicted lifetime greater than $10^6$ hours at a junction temperature of 225 C.

In particular, some embodiments are based on a discovery that certain dimensions associated with the mushroom or T-top gate of a GaN HEMT device may be strongly correlated with improvements in RF performance and/or reliability. These dimensions will be discussed in conjunction with the GaN HEMT structures illustrated in FIGS. 2 to 4C which will now be described in detail.

Figure 2:
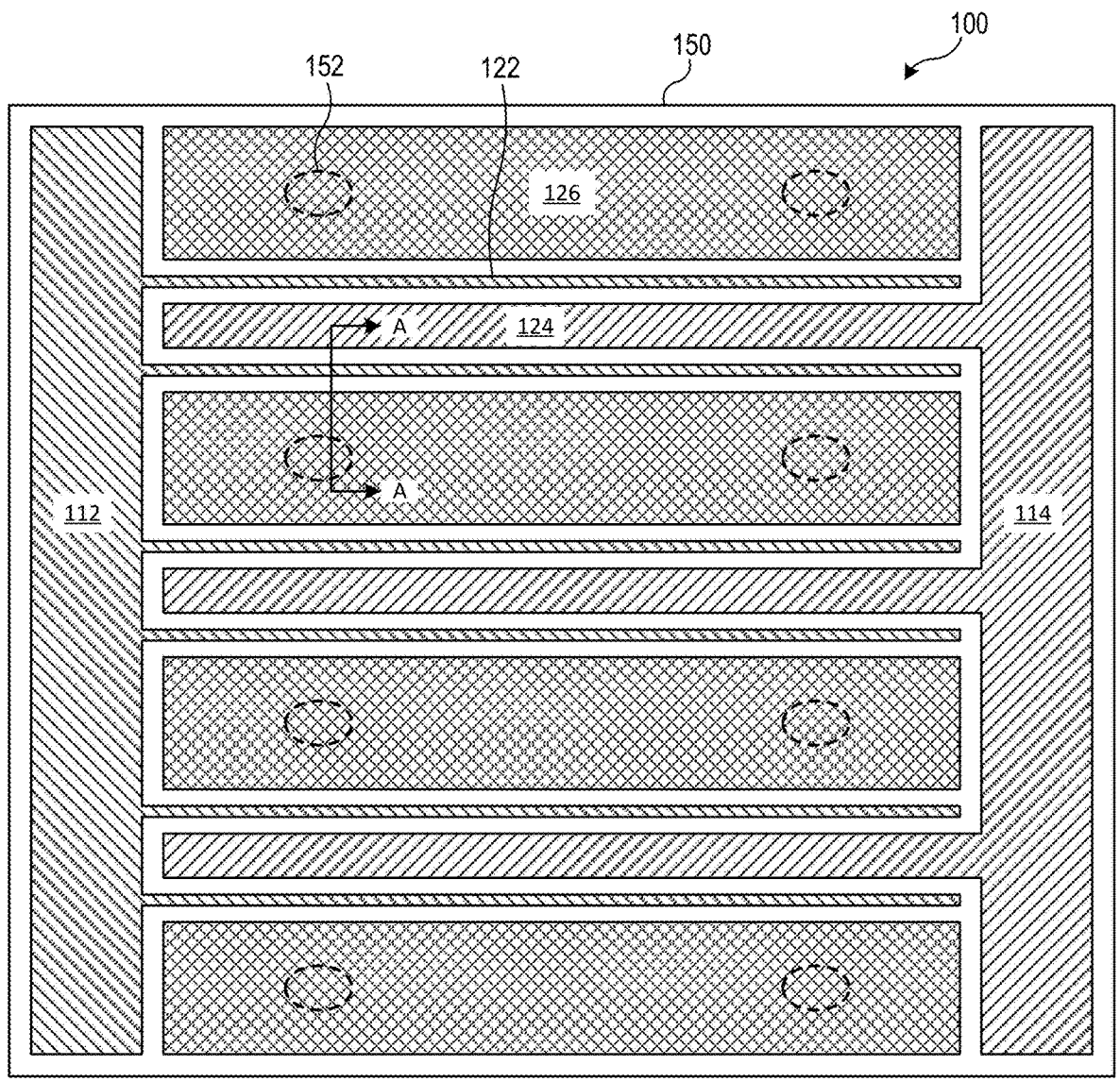
FIG. 2 is a schematic plan view of a HEMT device according to some embodiments.
Figure 3:
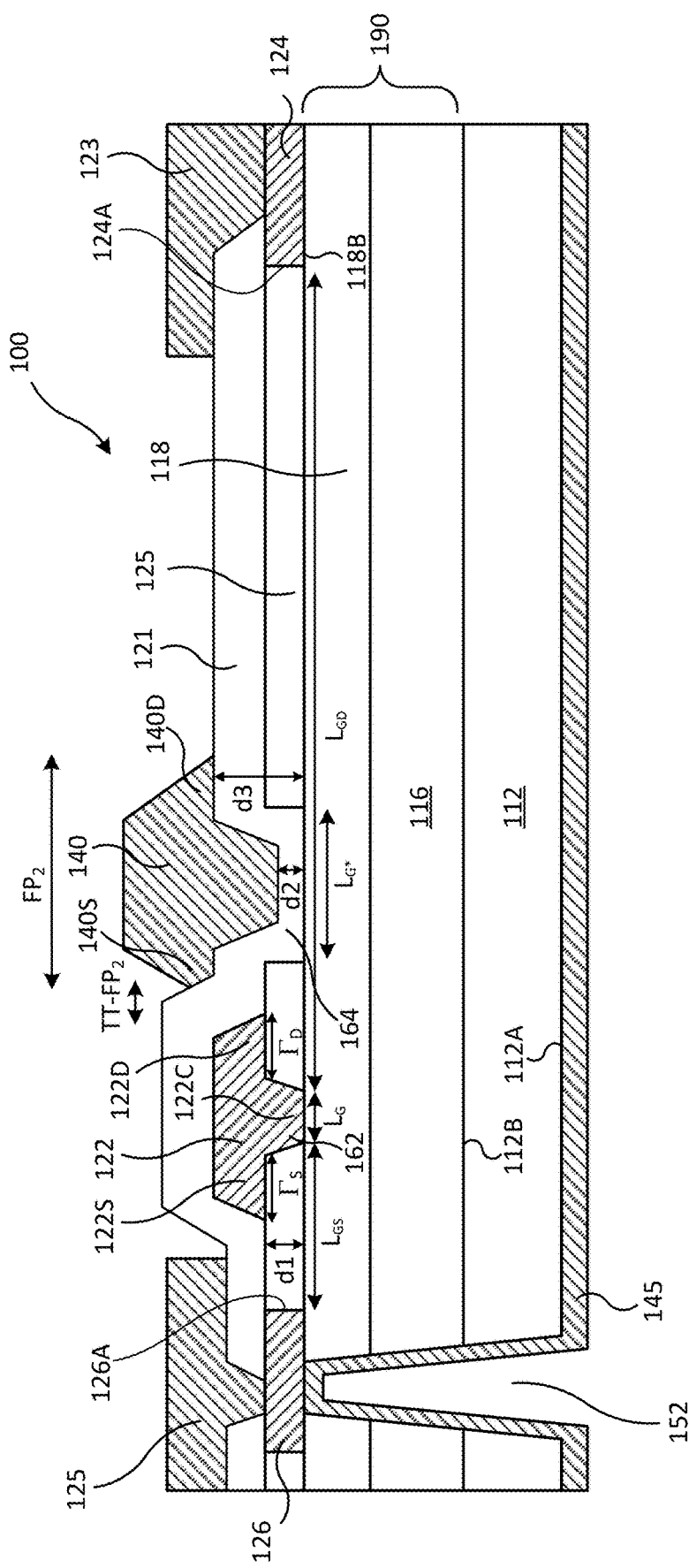
FIG. 3 is a schematic cross-sectional view of the HEMT device of FIG. 2 taken along line A-A' of FIG. 2.

FIG. 2 is a schematic plan view of a HEMT device 100 according to some embodiments, while FIG. 3 is a schematic cross-sectional view of the HEMT device 100 taken along line A-A' of FIG. 2. FIGS. 2 and 3 are intended to schematically represent various aspects of the device 100 for purposes of illustration and description and are not intended to represent the structures to physical scale.

As shown in FIGS. 2 and 3, a HEMT device 100, may be formed on a substrate 112 such as a silicon carbide SiC substrate or a sapphire substrate. The substrate 112 may be a semi-insulating silicon carbide (SiC) substrate that may be, for example, the 4H polytype of silicon carbide. Other silicon carbide candidate polytypes may include the 3C, 6H, and 15R polytypes. In some embodiments, the substrate may be a High Purity Semi-Insulating (HPSI) substrate, available from Cree, Inc.

In some embodiments, the silicon carbide bulk crystal of the substrate 112 may have a resistivity of about $10^5$ ohm-cm or higher at room temperature. Although silicon carbide may be used as a substrate material, embodiments of the present application may utilize any suitable substrate, such as sapphire ($Al_2O_3$), aluminum nitride (AlN), aluminum gallium nitride (AlGaN), gallium nitride (GaN), silicon (Si), GaAs, LGO, zinc oxide (ZnO), LAO, indium phosphide (InP), and the like. The substrate 112 may be a silicon carbide wafer, and the HEMT device 100 may be formed, at least in part, via wafer-level processing, and the wafer may then be diced to provide a plurality of individual high electron mobility transistors 100.

The substrate 112 may have a lower surface 112A and an upper surface 112B. In some embodiments, the substrate 112 of the HEMT device 100 may be a thinned substrate 112 to facilitate formation of a via 152 therethrough as described below. In some embodiments, the thickness of the substrate 112 (e.g., in a vertical direction that is normal to the lower and upper surfaces 112A, 112B) may be 100 µm or less. In some embodiments, the thickness of the substrate 112 may be 75 µm or less. In some embodiments, the thickness of the substrate 112 may be 50 µm or less. In some embodiments, the thickness of the substrate 112 may be between 75 µm and 100 µm (e.g., 3-4 mil).

A Group III-nitride based epitaxial layer structure 190 is formed on the substrate 112. As used herein, the term "Group III-nitride" refers to those semiconducting compounds formed between nitrogen (N) and the elements in Group III of the periodic table, usually aluminum (Al), gallium (Ga), and/or indium (In). The term also refers to ternary and quaternary (or higher) compounds such as, for example, AlGaN and AlInGaN. As is well understood by those in this art, the Group III elements can combine with nitrogen to farm binary (e.g., GaN), ternary (e.g., AlGaN, AlInN), and quaternary (e.g., AlInGaN) compounds. These compounds all have empirical formulas in which one mole of nitrogen is combined with a total of one mole of the Group III elements.

In particular, the epitaxial layer structure 190 includes a channel layer 116 formed on the upper surface 112B of the substrate 112 (or on the optional layers described further herein), and a barrier layer 118 formed on an upper surface of the channel layer 116. The channel layer 116 and the barrier layer 118 may each be formed by epitaxial growth. The channel layer 116 may have a bandgap that is less than the bandgap of the barrier layer 118, and the channel layer 116 may also have a larger electron affinity than the barrier layer 118.

The channel layer 116 and the barrier layer 118 may include Group III-nitride based materials. In some embodiments, the channel layer 116 may be a Group III nitride, such as $Al_xGa_{1-x}N$, where $0 \leq x < 1$, provided that the energy of the conduction band edge of the channel layer 116 is less than the energy of the conduction band edge of the barrier layer 118 at the interface between the channel layer 116 and the barrier layer 118. In certain embodiments, x=0, indicating that the channel layer 116 is GaN. The channel layer 116 may also be formed from other Group III-nitrides such as InGaN, AlInGaN or the like. The channel layer 116 may be undoped ("unintentionally doped") and may be grown to a thickness of greater than about 0.002 µm. In some embodiments, the channel layer may be selectively doped with, for example, silicon or other dopants. The channel layer 116 may also be a multi-layer structure, such as a superlattice or combinations of GaN, AlGaN or the like. The channel layer 116 may be under compressive strain in some embodiments.

In some embodiments, the barrier layer 118 is AlN, AlInN, AlGaN or AlInGaN or combinations of layers thereof. The barrier layer 118 may comprise a single layer or may be a multi-layer structure. In particular embodiments, the barrier layer 118 may be thick enough and may have a high enough aluminum (Al) composition and doping to induce a 2DEG at the interface between the channel layer 116 and the barrier layer 118. The barrier layer 118 may, for example, be from about 0.1 nm to about 30 nm thick, but not so thick as to cause cracking or substantial defect formation therein. In particular embodiments, the barrier layer 118 may have a thickness less than about 25 nm, and in particular may have a thickness of about 18 nm.

In certain embodiments, the barrier layer 118 is undoped or doped with an n-type dopant to a concentration less than about $10^{19}$ $cm^{-3}$. In some embodiments, the barrier layer 118 is $Al_xGa_{1-x}N$ where $0<x<1$. In particular embodiments, the aluminum concentration is about 25%. However, in other embodiments, the barrier layer 118 comprises AlGaN with an aluminum concentration of between about 5% and less than about 100%. In specific embodiments, the aluminum concentration is greater than about 20%. In some embodiments, the aluminum concentration may be about 20% to about 30%, and in some embodiments about 25%.

The channel layer 116 and/or the barrier layer 118 may be formed, for example, by metal-organic chemical vapor deposition (MOCVD), molecular beam epitaxy (MBE), or hydride vapor phase epitaxy (HVPE). As discussed above, a 2DEG layer is induced in the channel layer 116 at a junction between the channel layer 116 and the barrier layer 118. The 2DEG layer acts as a highly conductive layer that allows conduction between the source and drain regions of the device that are beneath the source contact 126 the drain contact 124, respectively.

While the device 100 is shown with a channel layer 116 and barrier layer 118 for purposes of illustration, The epitaxial layer structure 190 of the device 100 may include additional layers/structures/elements such as a buffer and/or nucleation layer(s) between channel layer 116 and substrate 112, and/or a cap layer on barrier layer 118. For example, an AlN buffer layer may be formed on the upper surface 112B of the substrate 112 to provide a crystal structure transition between the silicon carbide substrate 112 and the remainder of the HEMT device 100. Additionally, strain balancing transition layer(s) may also and/or alternatively be provided as described, for example, in U.S. Pat. No. 7,030,428, the disclosure of which is incorporated herein by reference as if set forth fully herein. The optional buffer/nucleation/transition layers may be deposited by MOCVD, MBE, and/or HVPE.

A source contact 126 and a drain contact 124 are formed on an upper surface 118B of the barrier layer 118 and are laterally spaced apart from each other. A gate contact 122 is formed on the upper surface 118B of the barrier layer 118 between the source contact 126 and the drain contact 124. The material of the gate contact 122 may be chosen based on the composition of the barrier layer 118, and may, in some embodiments, form a Schottky contact to the barrier layer 118. Conventional materials capable of making a Schottky contact to a gallium nitride based semiconductor material may be used, such as, for example, nickel (Ni), platinum (Pt), nickel silicide (NiSix), copper (Cu), palladium (Pd), chromium (Cr), tungsten (W) and/or tungsten silicon nitride (WSiN).

The source contact 126 and the drain contact 124 may include a metal that can form an ohmic contact to a gallium nitride based semiconductor material. Suitable metals may include refractory metals, such as Ti, W, titanium tungsten (TiW), silicon (Si), titanium tungsten nitride (TiWN), tungsten silicide (WSi), rhenium (Re), Niobium (Nb), Ni, gold (Au), aluminum (Al), tantalum (Ta), molybdenum (Mo), NiSix, titanium silicide (TiSi), titanium nitride (TiN), WSiN, Pt and the like. In some embodiments, the source contact 126 may be an ohmic source contact 126.

The source contact 126 may be coupled to a reference signal such as, for example, a ground voltage. The coupling to the reference signal may be provided by a via 152 that extends from a lower surface 112A of the substrate 112, through the substrate 112 to an upper surface of the barrier layer. The via 152 may expose a bottom surface of the source contact 126. A backmetal layer 145 is formed on the lower surface 112A of the substrate 112 and on side walls of the via 152. The backmetal layer 145 may directly contact the source contact 126. In some embodiments a contact area between the backmetal layer 145 and the bottom surface of the source contact 126 may be fifty percent or more of an area of the bottom surface of the source contact 126. Thus, the backmetal layer 145, and a signal coupled thereto, may be electrically connected to the source contact 126.

The dimensions of the device 100 may be decreased by directly connecting the via 152 to the source contact 126 without the requirement of an interconnecting metallization layer. As noted above, the substrate 112 may be thinned to allow for a reduction in the horizontal cross-sectional area of the via 152, further reducing the area of the device 100. In addition to the density improvements that may result from reducing the area of the device 100, an overall parasitic capacitance of the device 100 may also be decreased, which may lead to additional improvements in switching frequency of the resulting circuit.

The formation of the via 152 is described, for example, in U.S. Patent Publication No. 2020/0395475, the disclosure of which is incorporated herein by reference in its entirety.

In some embodiments, the via 152 may have an oval or circular cross-section when viewed in a plan view as shown in FIG. 2. However, the present inventive concepts are not limited thereto. In some embodiments, dimensions of the via (e.g., a length and/or a width) may be such that a largest cross-sectional area of the via 152 is 1000 μm2 or less. The cross-sectional area may be taken in a direction that is parallel to the lower surface 112A of the substrate 112.

In some embodiments, the source contact 126, the drain contact 124, and the gate contact 122 may be formed as a plurality of source contacts 126, drain contacts 124, and gate contacts 122 on the substrate 112. Referring to FIG. 2, a plurality of drain contacts 124 and source contacts 126 may be alternately arranged on the substrate 112. A gate contact 122 may be disposed between adjacent drain contacts 124 and source contacts 126 to define a plurality of transistor unit cells. As shown in FIG. 2, an ohmic source contact of a first one of the transistor unit cells may be shared with of a second one of the transistor unit cells.

A HEMT transistor unit cell may be defined by the active region between the source contact 126 and the drain contact 124 under the control of a gate contact 122 between the source contact 126 and the drain contact 124. As illustrated in FIG. 2, the HEMT device 100 may include adjacent HEMT unit transistors sharing a source contact 126. By sharing the source contact 126 between adjacent HEMT transistors and reducing a size of the via 152, the distance between adjacent source contacts 126 with at least one drain contact 124 therebetween may be reduced.

Referring again to FIG. 3, the HEMT device 100 according to some embodiments includes a first insulating layer 125 and a second insulating layer 121. The first insulating layer 125, which may comprise SiN, directly contacts the upper surface of the epitaxial layer structure 190 of the device 100 (e.g., contacts the upper surface of the barrier layer 118) and has a thickness d1. The thickness d1 may be between 60 nm and 80 nm. In particular, the thickness d1 may be about 70 nm.

The second insulating layer 121, which may comprise SiOx, SiN or SiON, is formed on the first insulating layer 125 and has a thickness d2. The thickness d2 may be between 190 nm and 230 nm. In particular, the thickness d2 may be about 210 nm.

It will also be appreciated that more than two insulating layers may be included in some embodiments. The first insulating layer 125 and the second insulating layer 121 may serve as passivation layers for the HEMT device 100, and may also act as insulating interlayers for separating metallization layers of the device 100. The present inventors have found that thicknesses first and second insulating layers 125, 121 are important design parameters for obtaining HEMT devices with high RF performance and high reliability.

The source contact 126, the drain contact 124, and the gate contact 122 may be formed to extend through the first insulating layer 125. In some embodiments, at least a portion of the gate contact 122 may be on the first insulating layer 125. In some embodiments, the gate contact 122 may be formed as a T-shaped gate and/or a gamma gate including a central contact portion 122C, a source-side wing portion 122S and a drain-side wing portion 122D. The second insulating layer 121 is formed on the first insulating layer 125 and on portions of the drain contact 124, gate contact 122, and source contact 126.

Figure 4A:
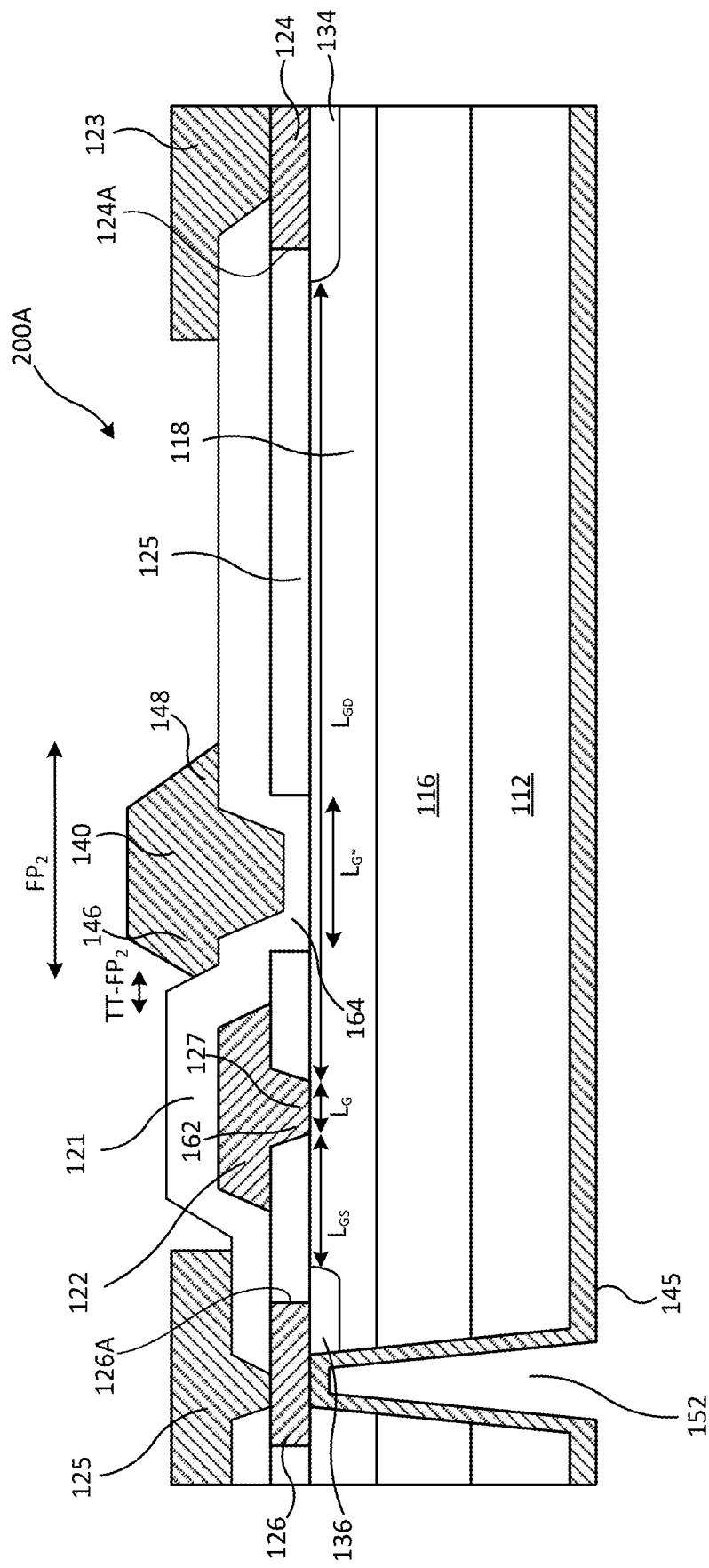
FIGS. 4A to 4D are cross-sectional views illustrating HEMT device structures according to various embodiments.

In particular, the gate contact 122 may have a central contact portion 122C that extends through an opening 162 in the first insulating layer 125. The gate contact 122 has a source side wing portion 122S that extends across an upper surface of the first insulating layer 125 toward the source contact 122 by a distance $\Gamma_S$ and a drain-side wing portion 122D that extends across an upper surface of the first insulating layer 125 toward the drain contact 124 by a distance $\Gamma_D$. In some embodiments, $\Gamma_S$ and $\Gamma_D$ may each be between about 0.1 μm and 0.3 μm. In particular embodiments, $\Gamma_S$ and $\Gamma_D$ may each be between about 0.2 μm. In some embodiments, $\Gamma_S$ and $\Gamma_D$ are equal such that the gate 122 is symmetric about the central contact portion 122C. In some embodiments, the length $\Gamma_S$ of the source side wing 122S may be greater than the length $\Gamma_D$ of the drain side wing 122D. In some embodiments, the length $\Gamma_D$ of the drain side wing 122D may be greater than the length $\Gamma_S$ of the source side wing 122S. In some embodiments, as illustrated in FIGS. 4D and 4E, either the source side wing 122S or the drain side wing 122S may be omitted entirely.

Both the source side wing 122S and the drain side wing 122D of the gate contact 122 are spaced apart from the barrier layer 118 by the distance d1, corresponding to the thickness of the first insulating layer 125. As noted above, the distance d1 may be between 60 nm and 80 nm. In particular embodiments, the distance d1 may be about 70 nm.

The width of the central contact portion 122C at the interface with the barrier layer 118 is indicated as $L_G$. In some embodiments, $L_G$ may be between about 200 nm and 300 nm, and in particular embodiments LG may be about 250 nm.

The contact portion 127 is spaced apart from the inner edge 126A of the source contact by a distance $L_{GS}$, and is spaced apart from the inner edge 124A of the drain contact by a distance $L_{GD}$. In some embodiments, $L_{GS}$ may be between about 0.8 µm and 1.2 µm, and in particular embodiments $L_{GS}$ may be about 1 µm. In some embodiments, $L_{GD}$ may be between about 3.2 µm and 3.8 µm, and in particular embodiments $L_{GD}$ may be about 3.5 µm.

One or more field plates 140 may be formed on the second insulating layer 121. The field plate 140 shown in FIG. 3 is spaced apart from the gate contact 122 toward the drain contact 124 by a distance TT-FP2. The distance TT-FP2 may be between about 0.3 µm and 0.5 µm, and in particular embodiments may be about 0.4 µm.

The field plate 140 may have an overall width $FP_2$ of about 0.9 µm to 0.95 µm, and in particular embodiments about 0.925 µm.

Figure 4B:
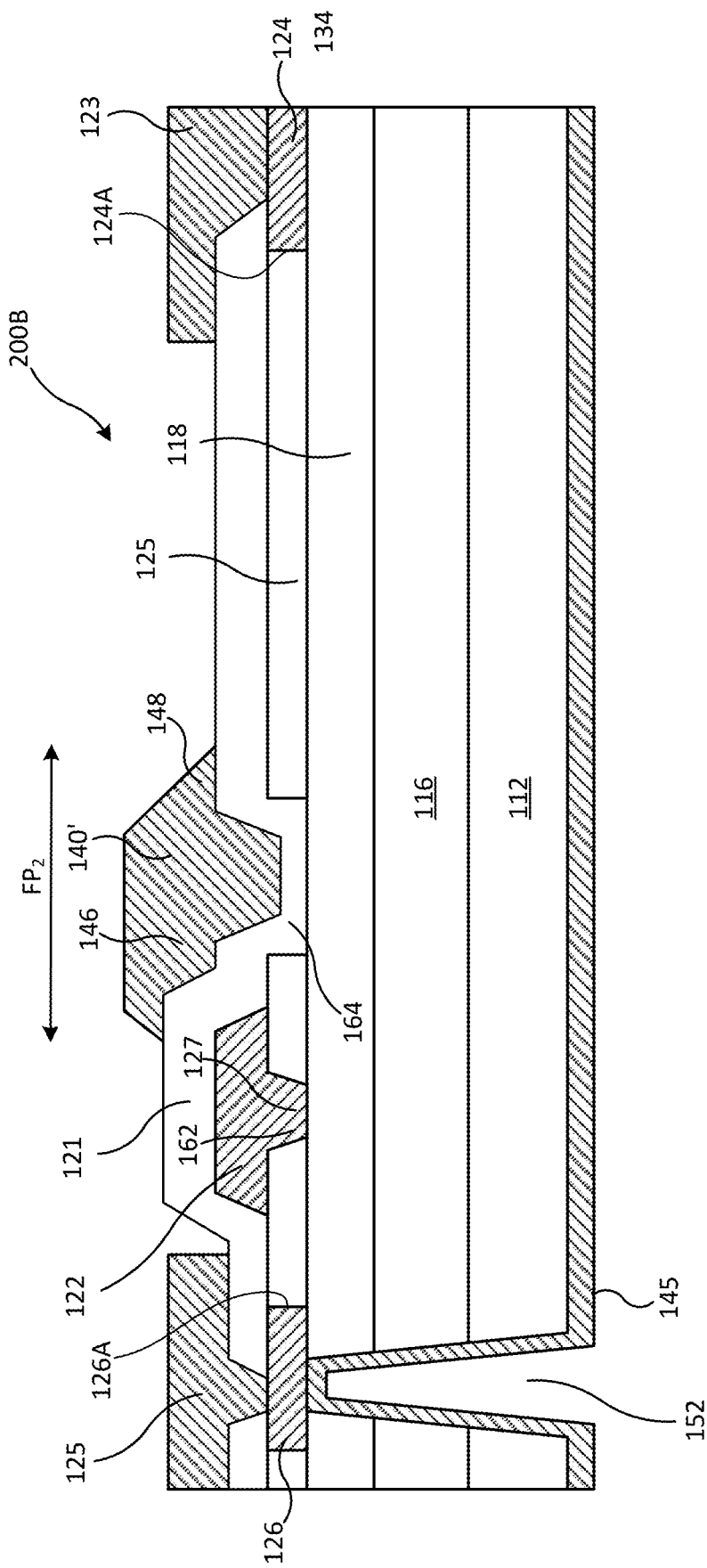

It will be appreciated that in some embodiments the field plate 140 may overlap the gate contact 122 in the vertical direction as shown in FIG. 4B. The field plate 140 can reduce the peak electric field in the HEMT device 100, which can result in increased breakdown voltage and reduced charge trapping. The reduction of the electric field can also yield other benefits, such as reduced leakage currents and enhanced reliability.

Although not illustrated in FIG. 3, a third insulating layer may be formed over the field plate 140, and a second field plate may be formed on the third insulating layer above the first field plate 140. The second field plate may overlap the first field plate 140 in the vertical direction and may extend toward the drain contact 124 to cover a portion of the epitaxial layer structure 190 between the first field plate 140 and the drain contact 124.

Like the gate 122, the field plate 140 may have a mushroom or T-top structure, including a central portion 140C, a source-side wing 140S and a drain-side wing 140D. The central portion 140C of the field plate 140 is spaced apart from the upper surface of the barrier layer 118 by a distance d2, which in the structure of FIG. 3 is defined by the thickness of the second insulating layer 121. As noted above, the distance d2 may be between 190 nm and 230 nm. In particular embodiments, the distance d2 may be about 210 nm.

The source-side wing 140S and the drain-side wing 140D may extend across the upper surface of the second insulating layer 121 such that they are spaced apart from the upper surface of the barrier layer 118 by a distance d3=d1+d2. The distance d3 may be between 250 nm and 310 nm. In particular embodiments, the distance d3 may be about 280 nm.

The field plate 140 may be conductively connected to the source contact 126 or the gate contact 122, or may be independently biased.

Metal contacts 123, 125 may be disposed in the second insulating layer 121. The metal contacts 123, 125 may provide interconnection between the drain contact 124 and source contact 126, respectively, and other parts of the HEMT device 100. The metal contacts 123, 125 may contain metal or other highly conductive material, including, for example, copper, cobalt, gold, and/or a composite metal. For ease of illustration, the second insulating layer 121, the field plate 140, and the metal contacts 123, 125 are not illustrated in FIG. 2.

In some embodiments, an opening 164 may be formed in the first insulating layer 125 prior to formation of the second insulating layer 121, so that the second insulating layer 121 extends through the first insulating layer 125 to contact the upper surface of the epitaxial layer structure 190 (e.g., the upper surface of the barrier layer 118). The opening 164 has a width $L_G^*$. The width of $L_G^*$ may be between about 0.8 µm and 1 µm, and in particular embodiments may be about 0.9 µm. The distance from the central portion 122C of the gate 122 to the opening 164 (e.g., $L_G$ to $L_G^*$) may be about 0.55 µm to 0.7 µm.

The field plate 140 is formed above the opening 164 so that the central portion of the field plate 140 is spaced apart from the epitaxial layer structure 190 (e.g., the upper surface 118B of the barrier layer 118) in the vertical direction by the distance d2.

FIGS. 4A to 4D illustrate GaN HEMT devices according to various further embodiments. For example, FIG. 4A illustrates a HEMT device 200A that is similar to the HEMT device 100 shown in FIG. 3 (with like reference signs referring to like elements), except that the device 200A includes doped source/drain regions 136, 134 in the barrier layer 118 that extend toward the gate to reduce the on-resistance of the device without impacting the gate to drain capacitance Cgd or drain to source capacitance Cds of the device. The doped source/drain regions 136, 134 may be formed as described, for example in U.S. application Ser. No. 17/144,346 entitled "RADIO FREQUENCY TRANSISTOR AMPLIFIERS HAVING WIDENED AND/OR ASYMMETRIC SOURCE/DRAIN REGIONS FOR IMPROVED ON-RESISTANCE PERFORMANCE," filed Jan. 8, 2021 and assigned to the assignee of the present application, the disclosure of which is incorporated herein by reference in its entirety.

As seen in FIG. 4A, in the device 200A, the values of $L_{GS}$ and $L_{GD}$ are measured from the edge of the respected doped regions 136, 134 rather than the position of the source and drain contacts 126, 124.

FIG. 4B illustrates a HEMT device 200B that is similar to the HEMT device 100 shown in FIG. 3 (with like reference signs referring to like elements), except that in the device 200B, the field plate 140 overlaps the gate 122 in the vertical direction (i.e., TT-FP2 is less than zero).

Figure 4C:
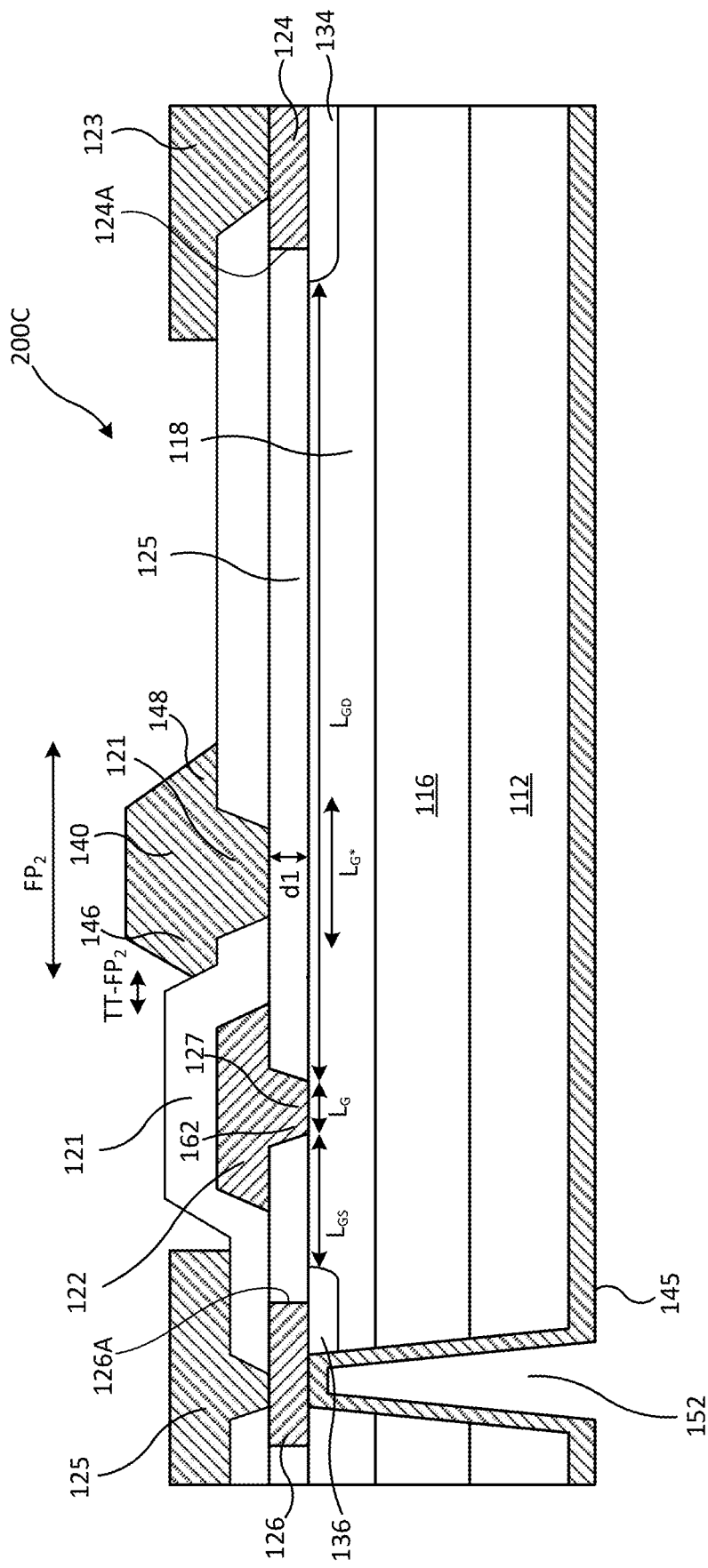
Figure 4D:
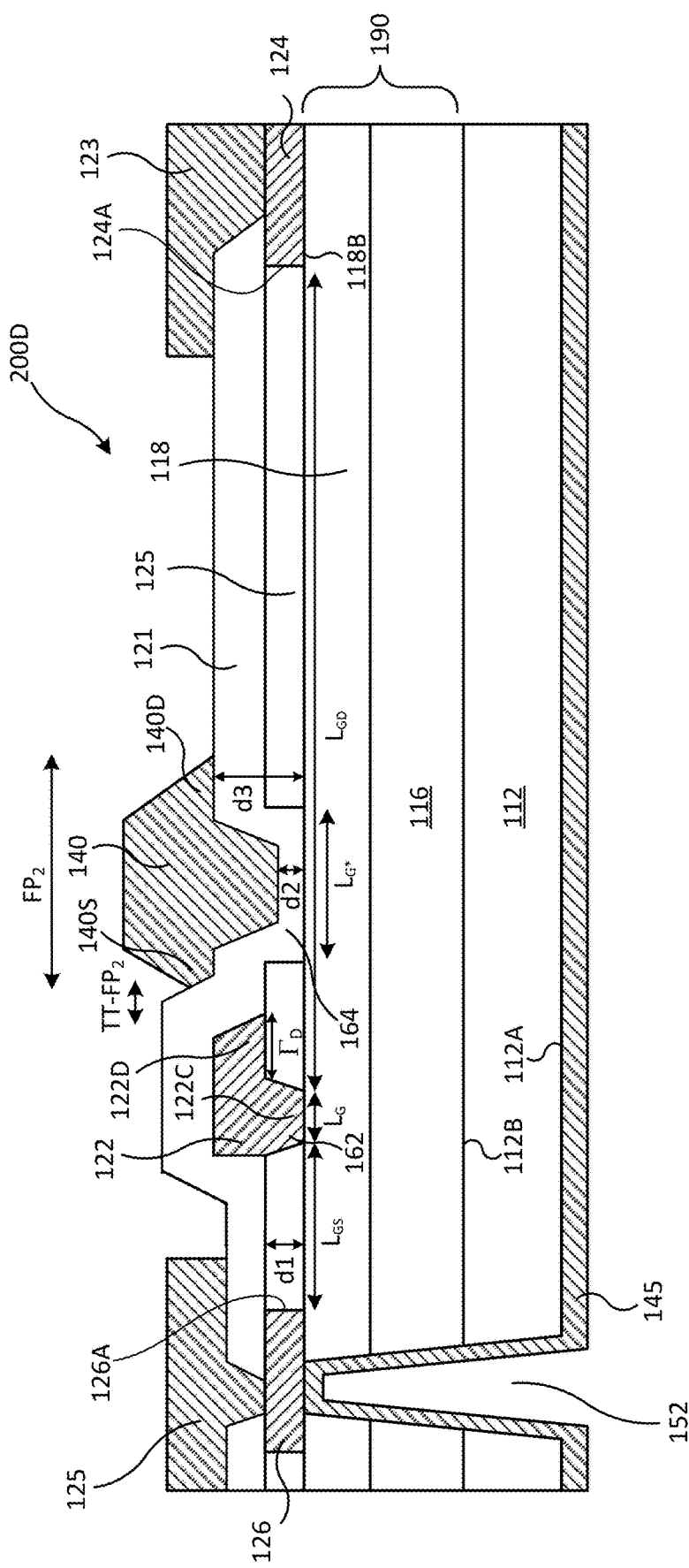

FIG. 4C illustrates a HEMT device 200C that is similar to the HEMT device 100 shown in FIG. 3 (with like reference signs referring to like elements), except that in the device 200C, there is no opening in the first insulating layer 125 beneath the field plate 140. Instead, the field plate 140 extends through an opening 151 in the second insulating layer 121, and the central portion of the field plate is separated from the barrier layer 118 by a distance d1 that corresponds to the thickness of the first insulating layer 125.

FIG. 4D illustrates a HEMT device 200D that is similar to the HEMT device 100 shown in FIG. 3 (with like reference signs referring to like elements), except that in the device 200C, the source-side wing 122S of the gate 122 is omitted (i.e., has a length $\Gamma_S$=0.) As noted above, in some embodiments, the gate 122 may have an asymmetric design with $\Gamma_S < >\Gamma_D$. In some embodiments, such as the embodiment illustrated in FIG. 4D, the source-side wing may be removed entirely.

It will be appreciated that the modifications shown in FIGS. 4A to 4D are not mutually exclusive, and various of the modifications illustrated therein (and others) may be made alone or together to the device shown in FIG. 3.

FIGS. 5A to 5H illustrate methods of fabricating a HEMT device, such as the HEMT device 100 of FIGS. 2 and 3, according to some embodiments.

Figure 5A:
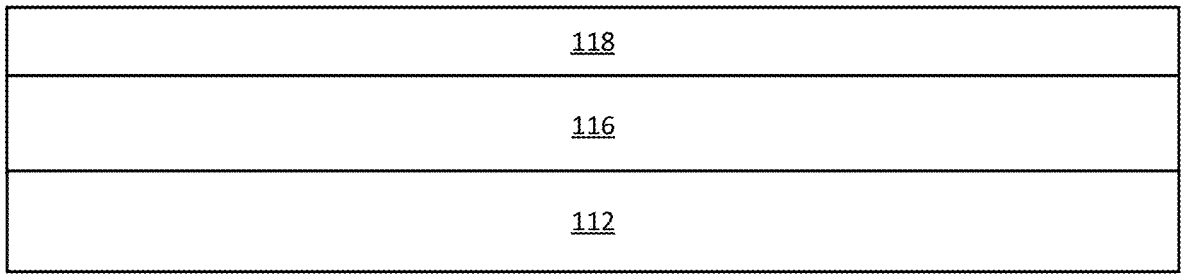
FIGS. 5A to 5H are cross-sectional views illustrating operations for manufacturing a transistor device including a field plate in accordance with some embodiments.

Referring now to FIG. 5A, a substrate 122 is provided on which an epitaxial semiconductor layer structure 190 may be formed. The epitaxial semiconductor layer structure 190 includes a channel layer 116 formed on the substrate 122, and a barrier layer 118 is formed on the channel layer 116. The substrate 122 may be a semi-insulating silicon carbide (SiC) substrate that may be, for example, the 4H polytype of silicon carbide. Other silicon carbide candidate polytypes may include the 3C, 6H, and 15R polytypes. A thickness of the substrate 122 may be 100 μm or greater.

Other suitable materials for the substrate 122 include sapphire (Al2O3), aluminum nitride (AlN), aluminum gallium nitride (AlGaN), gallium nitride (GaN), silicon (Si), GaAs, LGO, zinc oxide (ZnO), LAO, indium phosphide (InP), and the like.

Optional buffer, nucleation and/or transition layers (not shown) may also be provided on the substrate 122. For example, an AlN buffer layer may be provided to provide an appropriate crystal structure transition between a silicon carbide substrate and the remainder of the device. Additionally, strain balancing transition layer(s) may also be provided.

Still referring to FIG. 5A, a channel layer 116 is provided on the substrate 122. The channel layer 116 may be deposited on the substrate 122 using buffer layers, transition layers, and/or nucleation layers as described above. The channel layer 116 may be under compressive strain. Furthermore, the channel layer 116 and/or buffer, nucleation, and/or transition layers may be deposited by MOCVD, MBE, and/or HVPE. In some embodiments, the channel layer 116 may be a Group III-nitride layer.

The barrier layer 118 may be a Group III-nitride layer. In certain embodiments, the barrier layer 118 may be a highly-doped n-type layer. For example, the barrier layer 118 may be doped to a concentration of less than about 1019 cm-3.

In some embodiments, the barrier layer 118 may have a thickness, Al composition, and/or doping sufficient to induce a significant carrier concentration at the interface between the channel layer 116 and the barrier layer 118. Also, the barrier layer 118 may be thick enough to reduce or minimize scattering of electrons in the channel due to ionized impurities deposited at the interface between the barrier layer 118 and a subsequently formed first insulating layer.

In some embodiments, the channel layer 116 and the barrier layer 118 may have different lattice constants. For example, the barrier layer 118 may be a relatively thin layer having a smaller lattice constant than the channel layer 116, such that the barrier layer 118 "stretches" at the interface between the two. Accordingly, a pseudomorphic HEMT (pHEMT) device may be provided.

Figure 5B:
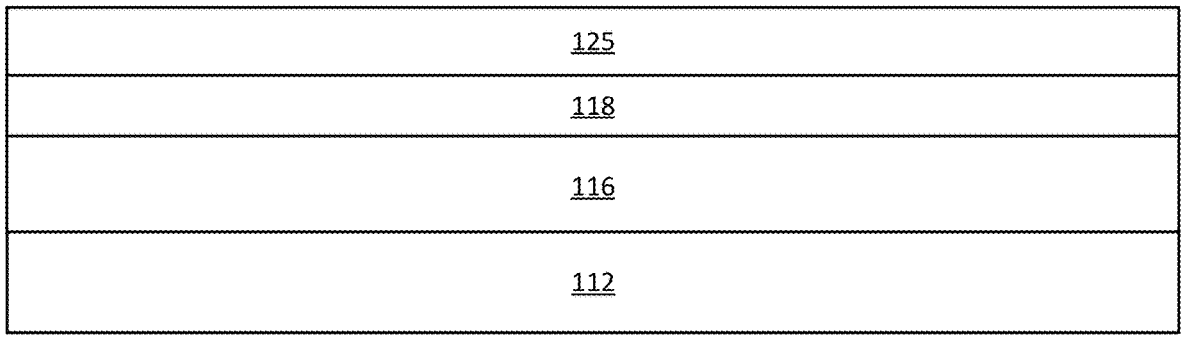

Referring to FIG. 5B, a first insulating layer 125 is formed on the barrier layer 118. The first insulating layer 125 may be dielectric material, such as silicon nitride (SixNy), aluminum nitride (AlN), silicon dioxide (SiO2), and/or other suitable protective material. Other materials may also be utilized for the first insulating layer 410. For example, the first insulating layer 410 may also include magnesium oxide, scandium oxide, aluminum oxide and/or aluminum oxynitride. Furthermore, the first insulating layer 410 may be a single layer or may include multiple layers of uniform and/or non-uniform composition.

The first insulating layer 125 is blanket formed on the barrier layer 118. For example, the first insulating layer 125 may be a silicon nitride (SiN) layer formed by high quality sputtering and/or plasma-enhanced chemical vapor deposition (PECVD), The first insulating layer 125 may be sufficiently thick so as to protect the underlying barrier layer 118 during a subsequent anneal of ohmic contacts.

Figure 5C:
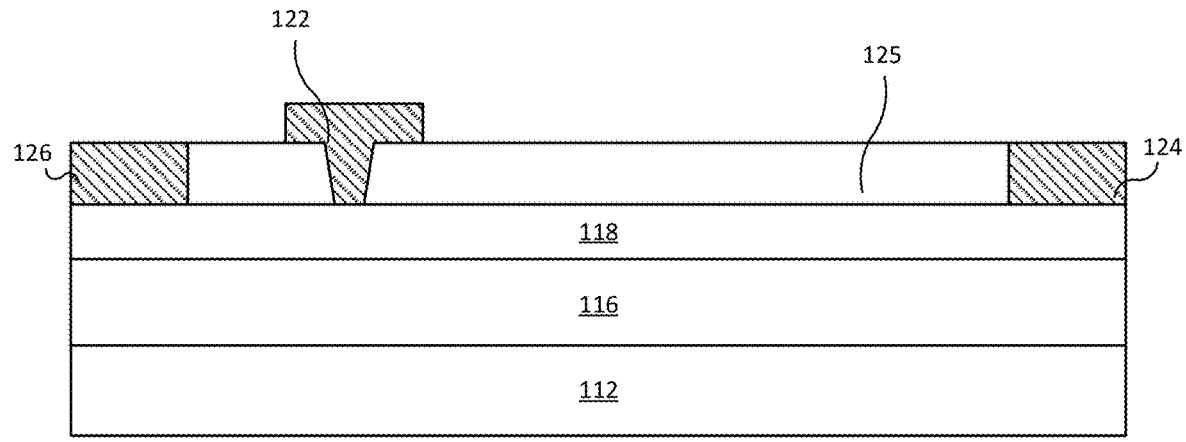

Referring to FIG. 5C, the first insulating layer 125 (see FIG. 5B) may be patterned to form openings for a source contact 126, gate contact 122, and drain contact 124. For example, the first insulating layer 125 may be patterned to form windows which expose the barrier layer 118 for placement of the source contact 126 and the drain contact 124. The windows may be etched utilizing a patterned mask and a low-damage etch with respect to the barrier layer 118. An ohmic metal may be formed on the exposed portions of the barrier layer 118. The ohmic metal may be annealed to provide the source contact 126 and the drain contacts 124.

The first insulating layer 125 may be etched to form an opening 127 that exposes the barrier layer 118 for placement of the gate contact 122. The gate contact 122 may be formed within the etched opening 127, and may extend through the first insulating layer 125 to contact the exposed portion of the barrier layer 118. Suitable gate materials may depend on the composition of the barrier layer 118. However, in certain embodiments, conventional materials capable of making a Schottky contact to a nitride based semiconductor material may be used, such as Ni, Pt, NiSix, Cu, Pd, Cr, TaN, W, and/or WSiN. Portion of the gate contact 122 may extend on a surface of the first insulating layer 125.

Although the source contact 126 is illustrated as being on the top surface of the barrier layer 118 in FIG. 5C, it will be understood that the source contact 126, gate contact 122, and/or drain contact 124 may be formed within recesses in the top surface of the barrier layer 118.

An opening 164 is formed in the first insulating layer 125 between the gate contact 122 and the drain contact 124. The opening 164 is positioned in a location corresponding to the field plate 140 (FIG. 3).

Figure 5D:
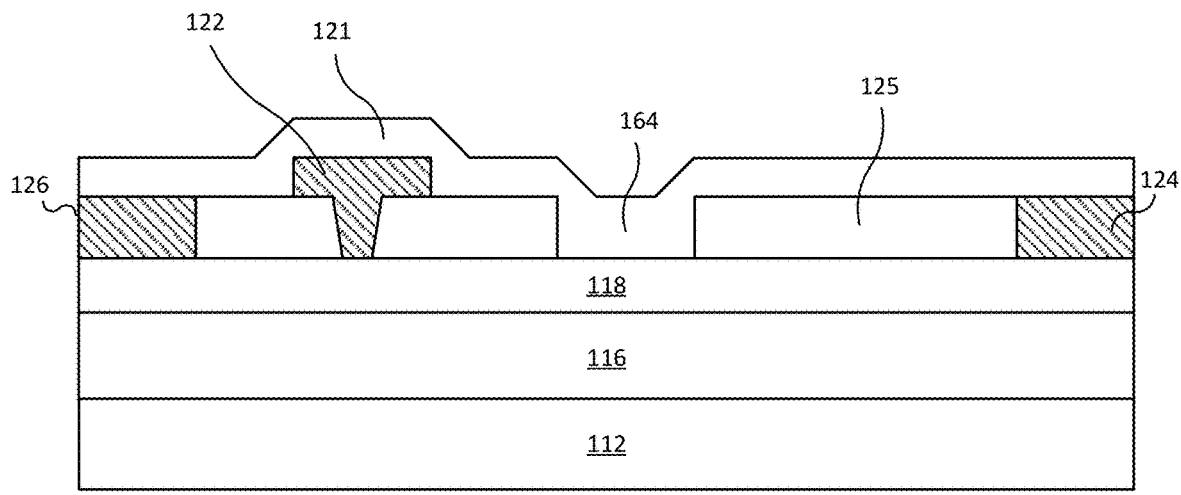

Referring to FIG. 5D, a second insulating layer 121 is formed on the first insulating layer 125, the source contact 126, gate contact 122, and drain contact 124. The second insulating layer 121 may be a dielectric layer. In some embodiments, the second insulating layer 121 may have a different dielectric index than the first insulating layer 125. The second insulating layer 121 extends into the opening 164 to contact the upper surface of the barrier layer 118.

Figure 5E:
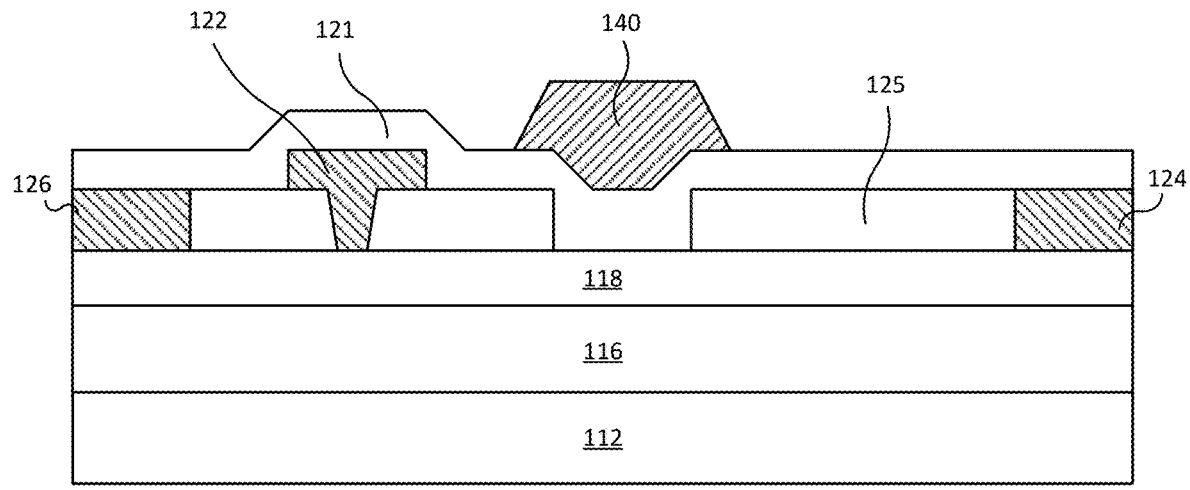

Referring to FIG. 5E, a field plate 140 is formed on the second insulating layer 121. The field plate 140 may be formed between the gate contact 122 and the drain contact 124 and may be spaced apart from the gate contact 122 by a distance TT-FP2. The field plate may extend a distance on the region between the gate and the drain (i.e., the gate-drain region). The field plate 140 may be formed over the opening 164 so that the field plate 140 is vertically spaced apart from the barrier layer 118 by a thickness d2 equal to the thickness of the second insulating layer 121. In some embodiments, the field plate 140 can be electrically connected to gate contact 122, and it is understood that field plate structures other than those illustrated in the figures may be used without deviating from the inventive concepts.

Figure 5F:
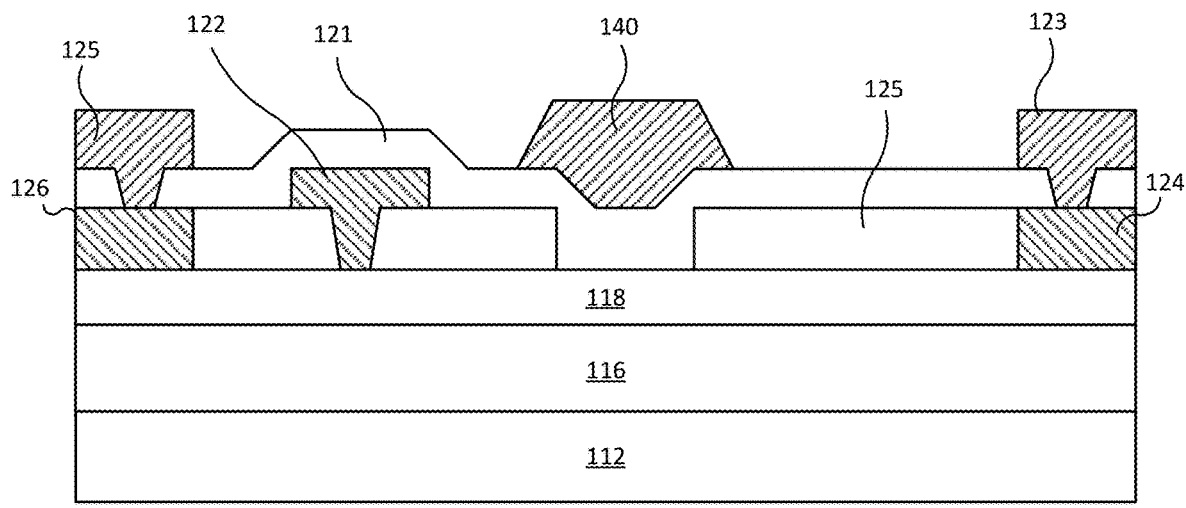

Referring to FIG. 5F, the second insulating layer 121 may be patterned to form openings for the metal contacts 123, 125. For example, the second insulating layer 121 may be patterned to form windows which expose portions of the source contacts 126 and/or the drain contacts 124 for placement of the metal contacts 123, 125. The windows may be etched utilizing a patterned mask and a low-damage etch with respect to the source contacts 126 and/or the drain contacts 124. Conductive metal may be formed on the exposed portions of the source contacts 126 and/or the drain contacts 124 to form the metal contacts 123, 125.

The substrate 122 may be thinned to form a thinned substrate 112. In some embodiments, the thickness of the substrate 112 may be reduced using a grinder, such as an in-feed or creep feed grinder. In other embodiments, the thickness of the substrate 112 is reduced using lapping, chemical or reactive ion etching or combinations of these approaches with or without grinding. In still other embodiments, etching may be used to treat the backside of the substrate 112 to reduce damage to the substrate 112 that may result from the thinning operation.

In some embodiments, the substrate 112 is thinned to a thickness of between about 40 μm to about 100 μm. In other embodiments, the substrate 112 is thinned to a thickness of between about 40 μm to about 75 μm.

Figure 5G:
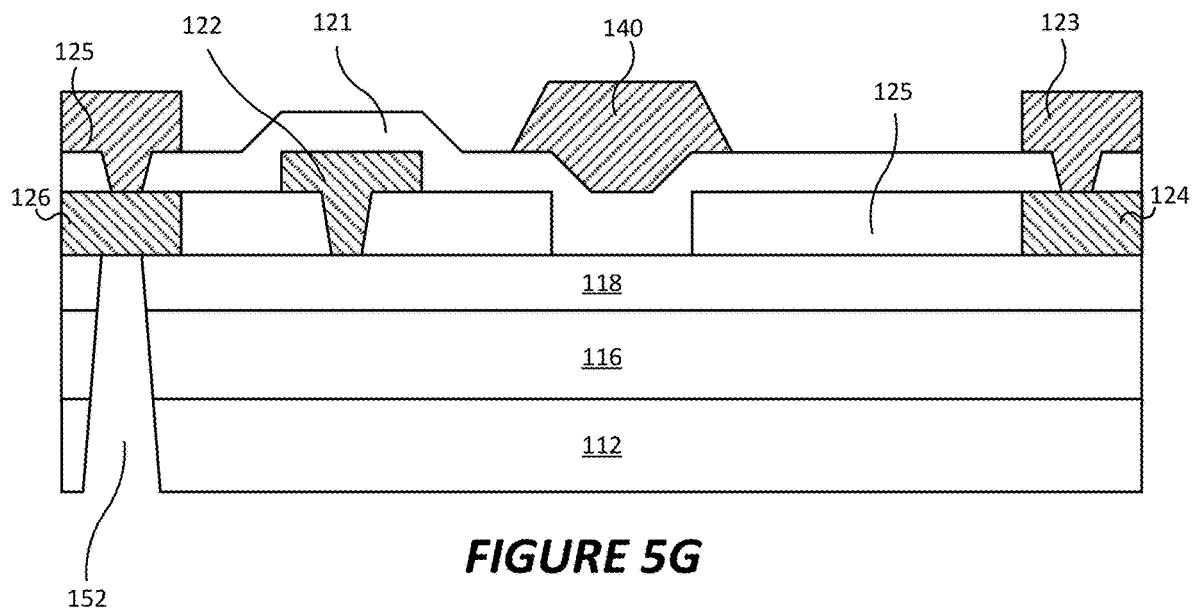

Referring to FIG. 5G, a via 152 may be formed in the substrate 112, the channel layer 116 and the barrier layer 118. The via 152 may be formed by wet or dry etching. In some embodiments, the via 152 may be anisotropically etched such that sidewalls of the via 152 are inclined with respect to a top surface of the substrate 112. The via 152 may expose a bottom surface of the source contact 126. In some embodiments, the source contact 126 may serve as an etch stop material during the formation of the via 152.

Due to the anisotropic etching, a largest cross-sectional area of the via 152 may be at that portion of the via 152 that is adjacent the lower surface 112A of the substrate 112 (e.g., the opening of the via 152). In some embodiments, the anisotropic etching may result in the largest cross-sectional area A2 of the via being related to a thickness of the substrate 112, as thicker substrates 112 may result in wider openings of the via 152. Thus, thinning the substrate 112, as described above may result in additional benefits due to the reduction of the cross-sectional area A2 of the via 152.

Figure 5H:
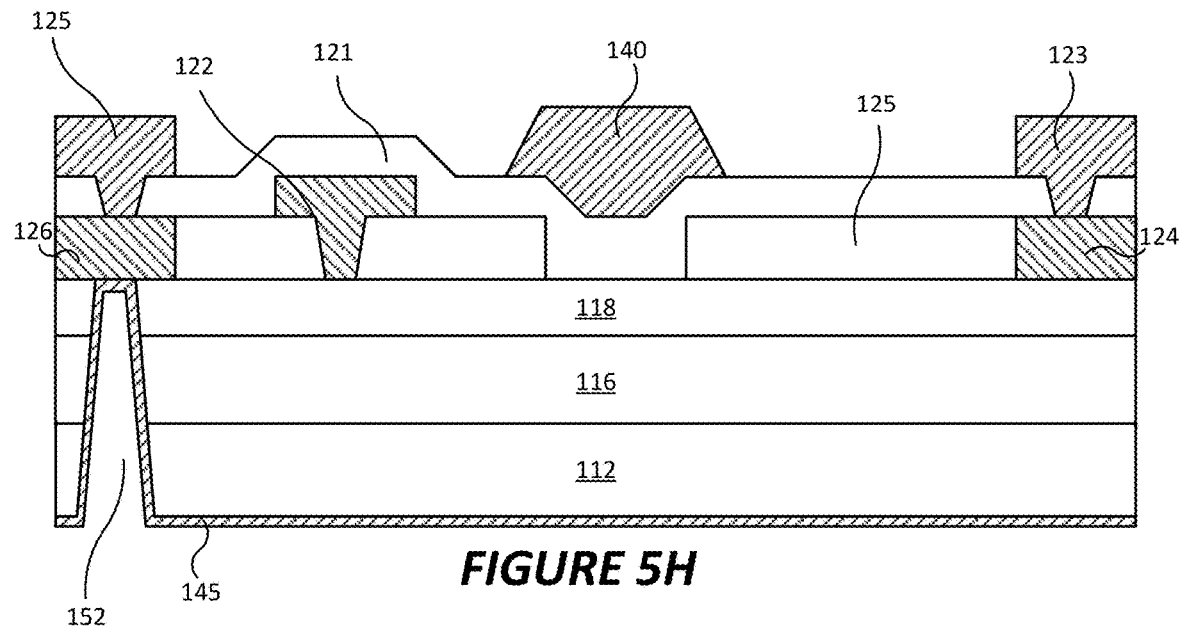

Referring to FIG. 5H, after formation of the via, a backmetal layer 145 may be deposited on the lower surface 112A of the substrate 112, sidewalls of the via 152, and the bottom surface of the source contact 126. Thus, the backmetal layer 145 may directly contact ohmic portions of the source contact 126. The backmetal layer 145 may include a conductive metal such as, for example, titanium, platinum, and/or gold.

The length $\Gamma_D$ of the drain side gate wing 122D is roughly proportional to the thickness d1 of the first insulating layer 125. That is, the thicker the first insulating layer 125 is, the larger the length $\Gamma_D$ of the drain side gate wing 122D must be. The length $\Gamma_D$ of the drain side gate wing 122D is related to the gate-to-drain capacitance Cgd of the device. Accordingly, it is desirable to shorten the length $\Gamma_D$ of the drain side gate wing 122D. However, this requires thinning the first insulating layer 125, which can reduce the reliability of the device. Typically, this is solved by increasing the length $\Gamma_D$ of the drain side gate wing 122D and adding a field plate to block the capacitance. However, this solution is imperfect, as the field plate cannot reduce Cgd. Some embodiments described herein are based on a discovery that an appropriate choice of particular device parameters including d1, $\Gamma_D$ and the thickness and aluminum concentration of the barrier layer 118 can surprisingly yield a device with both enhanced RF performance and enhanced reliability.

In particular, by providing a barrier layer that is thinner than 25 nm and that has an aluminum concentration greater than about 20%, the transconductance of the device can be increased, resulting in improved RF performance due to better gate control of the conductance of the device and higher cutoff frequency. In some embodiments, the aluminum concentration may be about 20% to about 30%, and in some embodiments about 25%.

Figure 6:
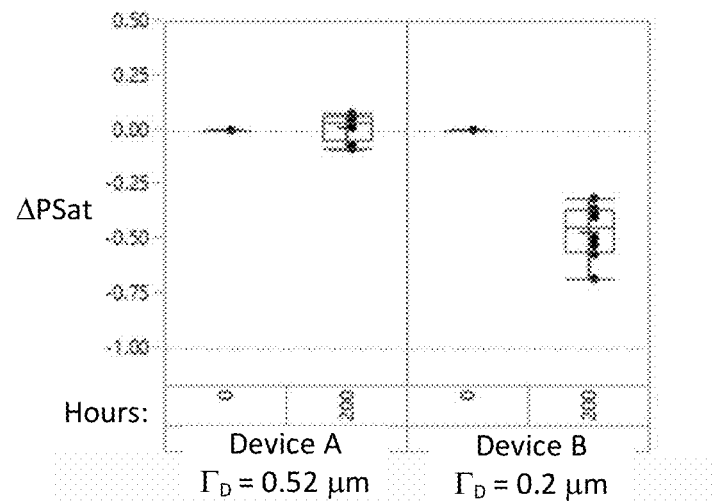
FIG. 6 is a graph that illustrates power degradation during accelerated testing of a device.

FIG. 6 illustrates power degradation during accelerated testing of a device as illustrated in FIGS. 2 and 3 at a junction temperature of 380 C for 200 hours. Some embodiments reduce the length $\Gamma_D$ of the drain-side gate wing 122D to improve RF performance. However, the saturated power (Plat) degrades (i.e., ΔPsat decreases) if the length $\Gamma_D$ of the drain-side gate wing 122D is too small. For example, the left side of FIG. 6 illustrates the change in saturated power ΔPsat for a group of devices (Device A) having a drain side wing with length $\Gamma_D$=0.52 μm, while the right side of FIG. 6 illustrates the change in saturated power ΔPsat for a group of devices (Device B) having a drain side wing with length $\Gamma_D$=0.2 μm. To counteract this effect, in some embodiments the thickness of the first passivation layer 125 is reduced to less than about 80 nm to reduce the saturated power degradation while maintaining the RF performance of the device.

Figure 7A:
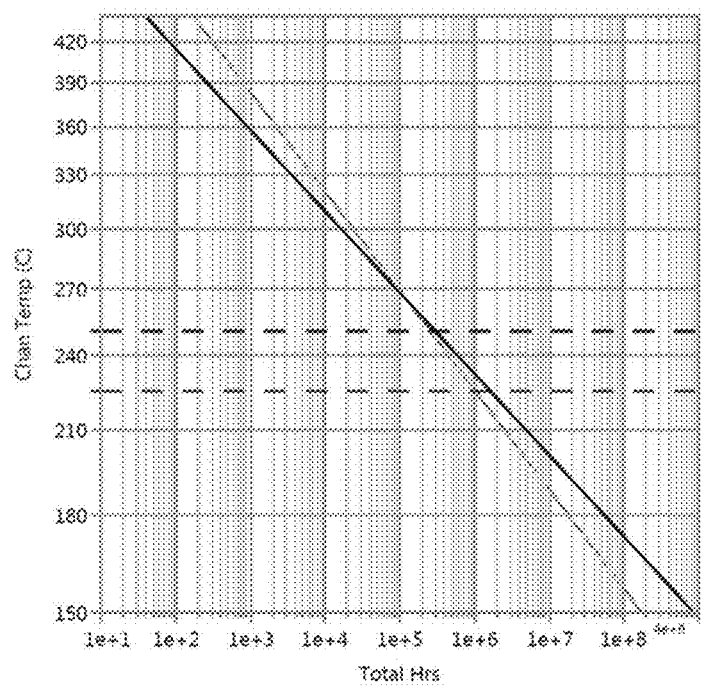
FIGS. 7A to 7C are graphs that illustrate effects on device reliability of changes of the thickness of the barrier layer of devices according to some embodiments.
Figure 7B:
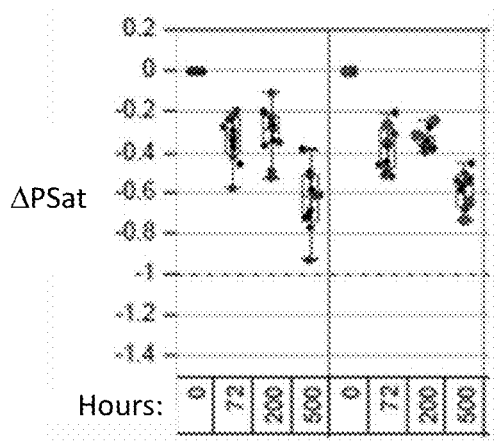
Figure 7C:
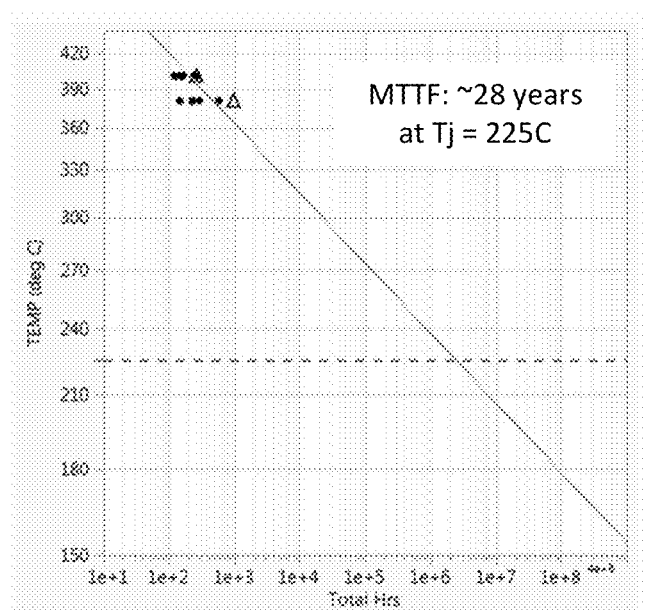

FIGS. 7A to 7C illustrate effects of changes of the thickness of the barrier layer 118 on device reliability. In particular, FIG. 7A is a comparison of RF accelerated lifetime testing results for devices having different barrier layer thicknesses (25 nm and 15 nm), and FIG. 7B illustrates Psat degradation vs time (hours) at a junction temperature 400 C for a device as illustrated in FIGS. 2 and 3 with a barrier layer thickness of 18 nm. As can be seen FIG. 7A, thinning the barrier layer 118 from 25 nm to 15 nm did not result in excess degradation of the devices.

FIG. 7C illustrates the results of RF accelerated lifetime testing that was conducted to predict the reliability of the devices at standard operating conditions. A device as illustrated in FIGS. 2 and 3 with a barrier layer thickness of 18 nm exceeded a lifetime projection of 228 years (>1e6 hours) at a junction temperature of 225 C.

Figure 8:
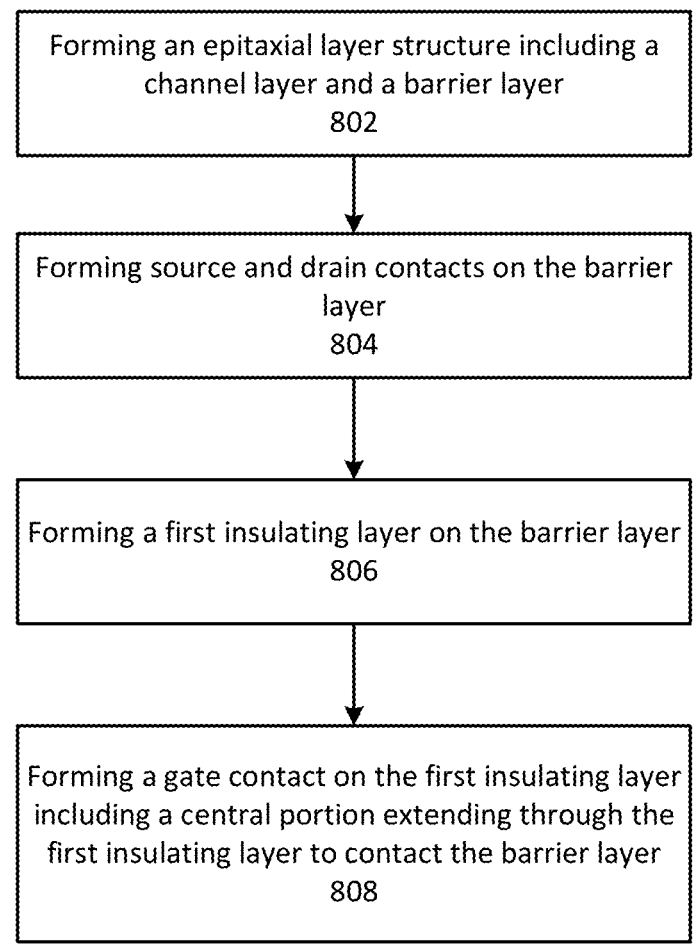
FIG. 8 is a block diagram illustrating operations of forming a transistor device according to some embodiments.

FIG. 8 is a block diagram illustrating operations of forming a transistor device according to some embodiments. Referring to FIG. 8 and FIGS. 5A to 5H, a method of forming a transistor device according to some embodiments includes forming (block 802) a semiconductor epitaxial layer structure including a channel layer and a barrier layer on the channel layer, wherein the barrier layer has a higher bandgap than the channel layer, and forming (block 804) a source contact and a drain contact on the barrier layer. The method further includes forming (block 806) a first insulating layer on the semiconductor layer between the source contact and the drain contact and forming (block 808) a gate contact on the first insulating layer. The gate contact includes a central portion that extends through the first insulating layer and contacts the barrier layer, and a drain side wing that extends laterally from the central portion of the gate toward the drain contact by a distance $\Gamma_D$. The drain side wing of the gate contact is spaced apart from the barrier layer by a distance d1 that is equal to a thickness of the first insulating layer. The distance $\Gamma_D$ is less than about 0.3 μm, and the distance d1 is less than about 80 nm.

Transistor devices as described herein may be used in amplifiers that operate in a wide variety of different frequency bands. In some embodiments, the RF transistor amplifiers incorporating transistor devices as described herein may be configured to operate at frequencies greater than 1 GHz. In other embodiments, the RF transistor amplifiers may be configured to operate at frequencies greater than 2.5 GHz. In still other embodiments, the RF transistor amplifiers may be configured to operate at frequencies greater than 3.1 GHz. In yet additional embodiments, the RF transistor amplifiers may be configured to operate at frequencies greater than 5 GHz. In some embodiments, the RF transistor amplifiers may be configured to operate in at least one of the 2.5-2.7 GHz, 3.4-4.2 GHz, 5.1-5.8 GHz, 12-18 GHz, 18-27 GHz, 27-40 GHz or 40-75 GHz frequency bands or sub-portions thereof.

Although embodiments of the inventive concepts have been discussed above with respect to HEMT devices, it will be understood that the inventive concepts described herein may be applied to other types of semiconductor devices, such as MOSFETs, DMOS transistors, and/or laterally diffused MOS (LDMOS) transistors.

RF transistor amplifiers incorporating transistor devices described herein can be used in standalone RF transistor amplifiers and/or in multiple RF transistor amplifiers. Examples of how the RF transistor amplifiers according to some embodiments may be used in applications that include multiple amplifiers will be discussed with reference to FIGS. 9A-9C.

Figure 9A:
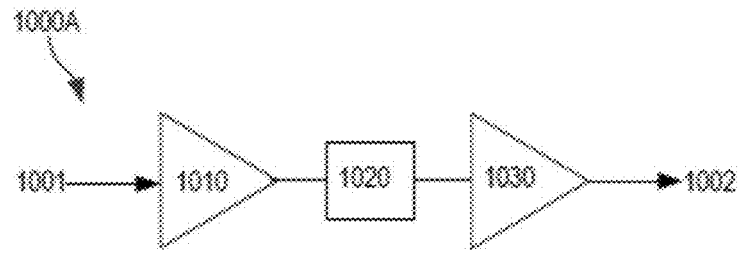
FIGS. 9A-9C are schematic block diagrams of multi-amplifier circuits in which RF transistor amplifiers incorporating transistor devices according to embodiments may be used.

Referring to FIG. 9A, an RF transistor amplifier 1000A is schematically illustrated that includes a pre-amplifier 1010 and a main amplifier 1030 that are electrically connected in series. As shown in FIG. 9A, RF transistor amplifier 1000A includes an RF input 1001, the pre-amplifier 1010, an inter-stage impedance matching network 1020, the main amplifier 1030, and an RF output 1002. The inter-stage impedance matching network 1020 may include, for example, inductors and/or capacitors arranged in any appropriate configuration in order to form a circuit that improves the impedance match between the output of pre-amplifier 1010 and the input of main amplifier 1030. While not shown in FIG. 9A, RF transistor amplifier 1000A may further include an input matching network that is interposed between RF input 1001 and pre-amplifier 1010, and/or an output matching network that is interposed between the main amplifier 1030 and the RF output 1002. The RF transistor amplifiers according to embodiments may be used to implement either or both of the pre-amplifier 1010 and the main amplifier 1030.

Figure 9B:
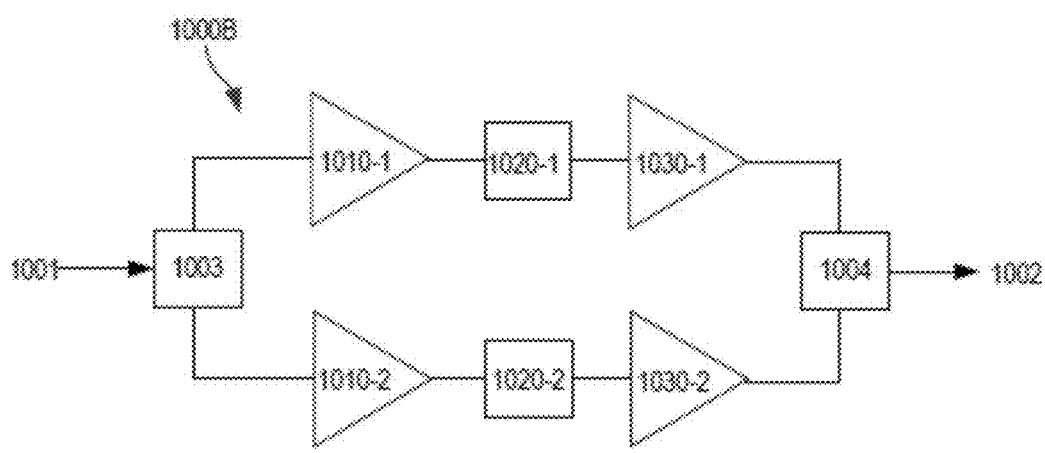

Referring to FIG. 9B, an RF transistor amplifier 1000B is schematically illustrated that includes an RF input 1001, a pair of pre-amplifiers 1010-1, 1010-2, a pair of inter-stage impedance matching networks 1020-1, 1020-2, a pair of main amplifiers 1030-1, 1030-2, and an RF output 1002. A splitter 1003 and a combiner 1004 are also provided. Pre-amplifier 1010-1 and main amplifier 1030-1 (which are electrically connected in series) are arranged electrically in parallel with pre-amplifier 1010-2 and main amplifier 1030-2 (which are electrically connected in series). As with the RF transistor amplifier 1000A of FIG. 9A, RF transistor amplifier 1000B may further include an input matching network that is interposed between RF input 1001 and pre-amplifiers 1010-1, 1010-2, and/or an output matching network that is interposed between the main amplifiers 1030-1, 1030-2 and the RF output 1002.

Figure 9C:
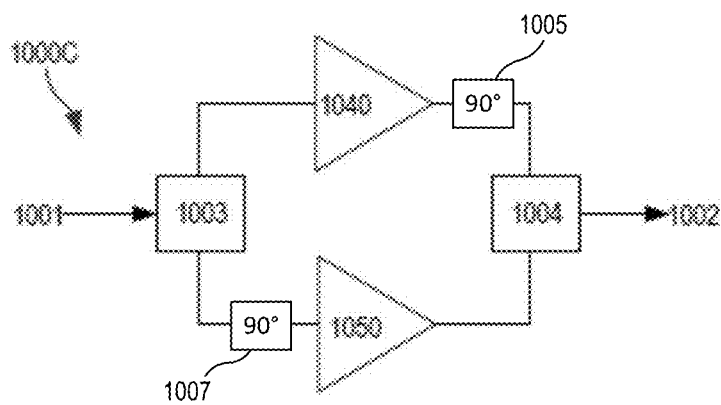

As shown in FIG. 9C, the RF transistor amplifiers according to some embodiments may also be used to implement Doherty amplifiers. As is known in the art, a Doherty amplifier circuit includes first and second (or more) power-combined amplifiers. The first amplifier is referred to as the "main" or "carrier" amplifier and the second amplifier is referred to as the "peaking" amplifier. The two amplifiers may be biased differently. For example, the main amplifier may comprise a Class AB or a Class B amplifier while the peaking amplifier may be a Class C amplifier in one common Doherty amplifier implementation. The Doherty amplifier may operate more efficiently than balanced amplifiers when operating at power levels that are backed off from saturation. An RF signal input to a Doherty amplifier is split (e.g., using a quadrature coupler), and the outputs of the two amplifiers are combined. The main amplifier is configured to turn on first (i.e., at lower input power levels) and hence only the main amplifier will operate at lower power levels. As the input power level is increased towards saturation, the peaking amplifier turns on and the input RF signal is split between the main and peaking amplifiers.

As shown in FIG. 9C, the Doherty RF transistor amplifier 1000C includes an RF input 1001, an input splitter 1003, a main amplifier 1040, a peaking amplifier 1050, an output combiner 1004 and an RF output 1002. The Doherty RF transistor amplifier 1000C includes a 90° transformer 1007 at the input of the peaking amplifier 1050 and a 90° transformer 1005 at the input of the main amplifier 1040, and may optionally include input matching networks and/or an output matching networks (not shown). The main amplifier 1040 and/or the peaking amplifier 1050 may be implemented using any of the above-described RF transistor amplifiers according to embodiments.

The RF transistor amplifiers according to embodiments may be formed as discrete devices, or may be formed as part of a Monolithic Microwave Integrated Circuit (MMIC). A MMIC refers to an integrated circuit that operates on radio and/or microwave frequency signals in which all of the circuitry for a particular function is integrated into a single semiconductor chip. An example MMIC device is a transistor amplifier that includes associated matching circuits, feed networks and the like that are all implemented on a common substrate. MMIC transistor amplifiers typically include a plurality of unit cell HEMT transistors that are connected in parallel.

Figure 10:
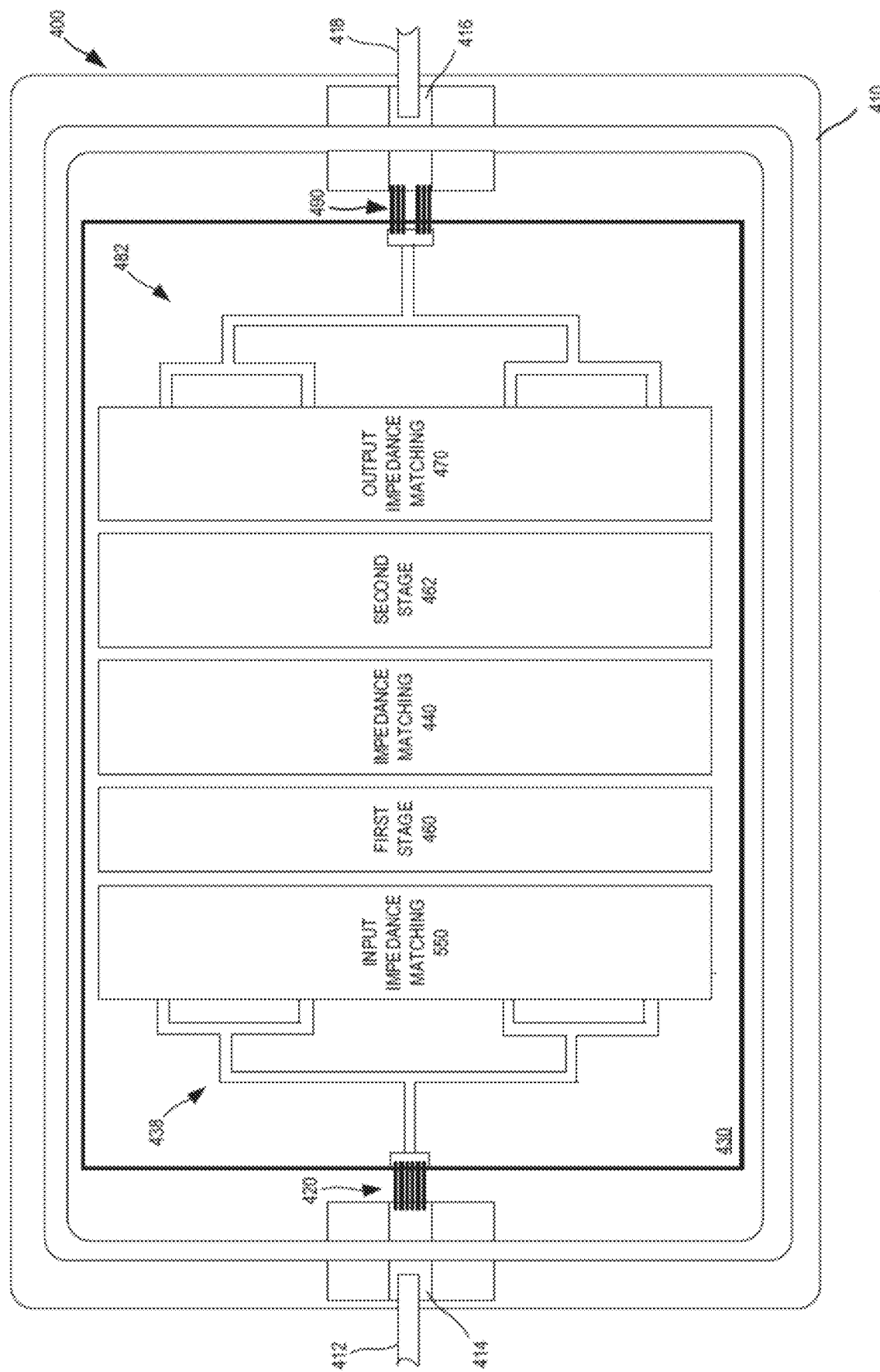
FIG. 10 is a schematic illustration of a MMIC amplifier including a HEMT transistor according to some embodiments.

FIG. 10 is a plan view of a MMIC RF transistor amplifier 400 according to embodiments of the present inventive concepts. As shown in FIG. 10, the MMIC RF transistor amplifier 400 includes an integrated circuit chip 430 that is contained within a package 410. The package 410 may comprise a protective housing that surrounds and protects the integrated circuit chip 430. The package 410 may be formed of, for example, a ceramic material.

The package 410 includes an input lead 412 and an output lead 418. The input lead 412 may be mounted to an input lead pad 414 by, for example, soldering. One or more input bond wires 420 may electrically connect the input lead pad 414 to an input bond pad on the integrated circuit chip 430. The integrated circuit chip 430 includes an input feed network 438, an input impedance matching network 450, a first RF transistor amplifier stage 460, an intermediate impedance matching network 440, a second RF transistor amplifier stage 462, an output impedance matching stage 470, and an output feed network 482.

The package 410 further includes an output lead 418 that is connected to an output lead pad 416 by, for example, soldering. One or more output bond wires 490 may electrically connect the output lead pad 416 to an output bond pad on the integrated circuit chip 430. The first RF transistor amplifier stage 460 and/or the second RF transistor amplifier stage 462 may be implemented using any of the RF transistor amplifiers according to embodiments of the present inventive concepts.

The RF transistor amplifiers according to embodiments of the present inventive concepts may be designed to operate in a wide variety of different frequency bands. In some embodiments, these RF transistor amplifier dies may be configured to operate in at least one of the 0.6-2.7 GHz, 3.4-4.2 GHz, 5.1-5.8 GHz, 12-18 GHz, 18-27 GHz, 27-40 GHz or 40-75 GHz frequency bands or sub-portions thereof. The techniques according to embodiments of the present inventive concepts may be particularly advantageous for RF transistor amplifiers that operate at frequencies of 10 GHz and higher.

Figure 11A:
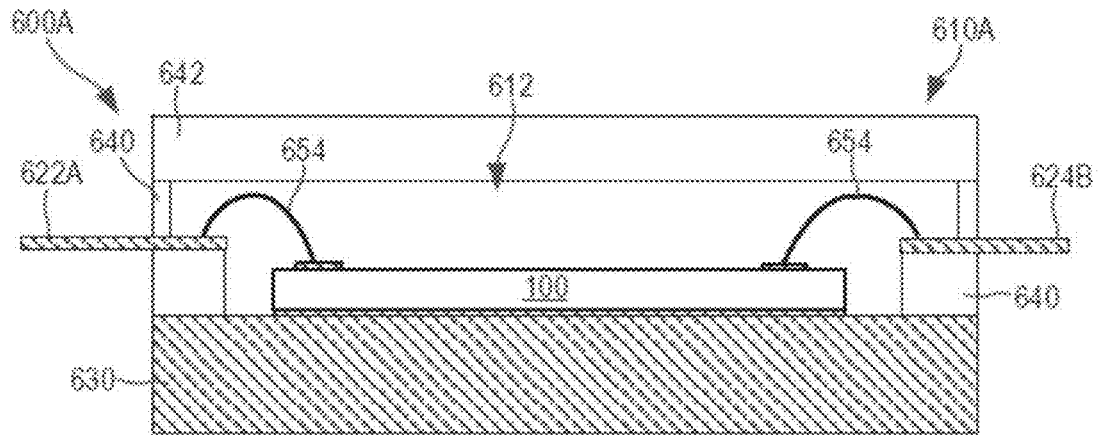
FIGS. 11A and 11B are schematic cross-sectional views illustrating example packages for RF transistor amplifier dies according to some embodiments.
Figure 11B:
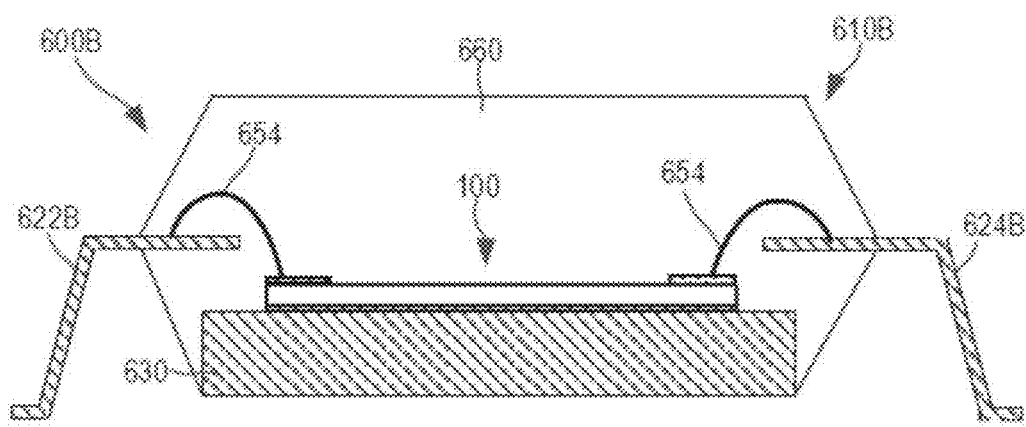

FIGS. 11A and 11B are schematic cross-sectional views illustrating several example ways that that the RF transistor amplifier dies according to embodiments of the present inventive concepts may be packaged to provide packaged RF transistor amplifiers 600A and 600B, respectively.

FIG. 11A is a schematic side view of a packaged Group III nitride-based RF transistor amplifier 600A. As shown in FIG. 11A, packaged RF transistor amplifier 600A includes the RF transistor amplifier die 100 packaged in an open cavity package 610A. The package 610A includes metal gate leads 622A, metal drain leads 624A, a metal submount 630, sidewalls 640 and a lid 642.

The submount 630 may include materials configured to assist with the thermal management of the package 600A. For example, the submount 630 may include copper and/or molybdenum. In some embodiments, the submount 630 may be composed of multiple layers and/or contain vias/interconnects. In an example embodiment, the submount 630 may be a multilayer copper/molybdenum/copper metal flange that comprises a core molybdenum layer with copper cladding layers on either major surface thereof. In some embodiments, the submount 630 may include a metal heat sink that is part of a lead frame or metal slug. The sidewalls 640 and/or lid 642 may be formed of or include an insulating material in some embodiments. For example, the sidewalls 640 and/or lid 642 may be formed of or include ceramic materials.

In some embodiments, the sidewalls 640 and/or lid 642 may be formed of, for example, Al2O3. The lid 642 may be glued to the sidewalls 640 using an epoxy glue. The sidewalls 640 may be attached to the submount 630 via, for example, braising. The gate lead 622A and the drain lead 624A may be configured to extend through the sidewalls 640, though embodiments of the present inventive concepts are not limited thereto.

The RF transistor amplifier die 100 is mounted on the upper surface of the metal submount 630 in an air-filled cavity 612 defined by the metal submount 630, the ceramic sidewalls 640 and the ceramic lid 642. The gate and drain terminals of RF transistor amplifier die 100 may be on the top side of the structure, while the source terminal is on the bottom side of the structure.

The gate lead 622A may be connected to the gate terminal of RF transistor amplifier die 100 by one or more bond wires 654. Similarly, the drain lead 624A may be connected to the drain terminal of RF transistor amplifier die 100 by one or more bond wires 654. The source terminal may be mounted on the metal submount 630 using, for example, a conductive die attach material (not shown). The metal submount 630 may provide the electrical connection to the source terminal 126 and may also serve as a heat dissipation structure that dissipates heat that is generated in the RF transistor amplifier die 100.

The heat is primarily generated in the upper portion of the RF transistor amplifier die 100 where relatively high current densities are generated in, for example, the channel regions of the unit cell transistors. This heat may be transferred though the source vias 146 and the semiconductor layer structure of the device to the source terminal and then to the metal submount 630.

FIG. 11B is a schematic side view of another packaged Group III nitride based RF transistor amplifier 600B. RF transistor amplifier 600B differs from RF transistor amplifier 600A in that it includes a different package 610B. The package 610B includes a metal submount 630, as well as metal gate and drain leads 622B, 624B. RF transistor amplifier 600B also includes a plastic overmold 660 that at least partially surrounds the RF transistor amplifier die 100, the leads 622B, 624B, and the metal submount 630.

Many variations of the features of the above embodiments are possible. Transistor structures with features that may be used in embodiments of the present invention are disclosed in the following commonly assigned publications, the contents of each of which are fully incorporated by reference herein in their entirety: U.S. Pat. No. 6,849,882 to Chavarkar et al. and entitled "Group-III Nitride Based High Electron Mobility Transistor (HEMT) With Barrier/Spacer Layer"; U.S. Pat. No. 7,230,284 to Parikh et al. and entitled "Insulating Gate AlGaN/GaN HEMT"; U.S. Pat. No. 7,501,669 to Parikh et al. and entitled "Wide Bandgap Transistor Devices With Field Plates"; U.S. Pat. No. 7,126,426 to Mishra et al. and entitled "Cascode Amplifier Structures Including Wide Bandgap Field Effect Transistor With Field Plates"; U.S. Pat. No. 7,550,783 to Wu et al. and entitled "Wide Bandgap HEMTs With Source Connected Field Plates"; U.S. Pat. No. 7,573,078 to Wu et al. and entitled "Wide Bandgap Transistors With Multiple Field Plates"; U.S. Pat. Pub. No. 2005/0253167 to Wu et al. and entitled "Wide Bandgap Field Effect Transistors With Source Connected Field Plates"; U.S. Pat. Pub. No. 2006/0202272 to Wu et al. and entitled "Wide Bandgap Transistors With Gate-Source Field Plates"; U.S. Pat. Pub. No. 2008/0128752 to Wu and entitled "GaN Based HEMTs With Buried Field Plates"; U.S. Pat. Pub. No. 2010/0276698 to Moore et al. and entitled "Gate Electrodes For Millimeter-Wave Operation and Methods of Fabrication; U.S. Pat. Pub. No. 2012/0049973 to Smith, Jr. et al. and entitled "High Power Gallium Nitride Field Effect Transistor Switches"; U.S. Pat. Pub. No. 2012/0194276 to Fisher and entitled "Low Noise Amplifiers Including Group III Nitride Based High Electron Mobility Transistors"; and U.S. Pat. No. 9,847,411 to Sriram et al. entitled "Recessed field plate transistor structures."

Although embodiments of the inventive concepts have been described in considerable detail with reference to certain configurations thereof, other versions are possible. The field plates and gates can also have many different shapes and can be connected to the source contact in many different ways. Accordingly, the spirit and scope of the invention should not be limited to the specific embodiments described above.

What is claimed is:

1. A transistor device, comprising:
   a semiconductor epitaxial layer structure including a channel layer and a barrier layer on the channel layer, wherein the barrier layer has a higher bandgap than the channel layer;
   a source contact and a drain contact on the barrier layer;
   a first insulating layer on the barrier layer between the source contact and the drain contact; and
   a gate contact on the first insulating layer, the gate contact comprising a central portion that extends through the first insulating layer and contacts the barrier layer, and a drain side wing that extends laterally from the central portion of the gate contact toward the drain contact by a distance GD, wherein the drain side wing of the gate contact is spaced apart from the barrier layer by a distance d1 that is equal to a thickness of the first insulating layer;
   wherein the distance GD is less than about 0.3 μm; and the distance d1 is less than about 80 nm;
   wherein the transistor device exhibits an output power greater than 9 W/mm at an operating frequency of 10 GHz at a gate voltage of 50V while demonstrating a predicted lifetime greater than $10^6$ hours at a junction temperature of 225 C.

2. The transistor device of claim 1, wherein the distance GD is between about 0.1 μm and 0.3 μm.

3. The transistor device of claim 1, wherein the distance d1 is between about 60 nm and 80 nm.

4. The transistor device of claim 1, wherein the barrier layer comprises AlGaN with an aluminum concentration greater than 20% and a thickness of less than 25 nm.

5. The transistor device of claim 1, wherein the distance GD is about 0.2 μm and the distance d1 is about 70 nm.

6. The transistor device of claim 1, wherein a distance LGS between the central portion of the gate contact and the source contact is between about 0.8 μm and 1.2 μm.

7. The transistor device of claim 1, wherein a distance LGD between the central portion of the gate contact and the drain contact is between about 3.2 μm and 3.8 μm.

8. The transistor device of claim 1, further comprising a substrate, wherein the semiconductor epitaxial layer structure is formed on the substrate, wherein the substrate comprises silicon carbide and has a thickness of less than about 100 μm.

9. The transistor device of claim 1, wherein the gate contact comprises a source side wing that extends laterally from the central portion of the gate toward the source contact by a distance GS, and wherein the distance GS is less than about 0.3 μm.

10. The transistor device of claim 9, wherein the distance GS is less than the distance GD.

11. The transistor device of claim 1, further comprising a field plate above the semiconductor epitaxial layer structure between the gate contact and the drain contact, wherein the field plate includes a central portion that is spaced apart from the barrier layer by a distance d2, wherein the distance d2 is less than 250 nm.

12. The transistor device of claim 11, wherein the distance d2 is between 190 nm and 230 nm.

13. The transistor device of claim 11, wherein the field plate is laterally spaced apart from the gate contact by a distance TT-FP2, wherein the distance TT-FP2 is between about 0.3 μm and 0.5 μm.

14. The transistor device of claim 11, wherein the field plate comprises a central field plate portion, a source side field plate wing extending away from the central field plate portion toward the source contact and a drain side field plate wing extending away from the central field plate portion toward the source contact, wherein the source side field plate wing and the drain side field plate wing are spaced apart from the barrier layer by a distance d3 that is between about 250 nm and 310 nm.

15. The transistor device of claim 1, wherein the central portion of the gate contact has a width of about 200 nm to 300 nm at an interface with the barrier layer.

16. The transistor device of claim 1, wherein the transistor device exhibits a peak power added efficiency (PAE) greater than 60% at a gate voltage of 50V while demonstrating a predicted lifetime greater than 106 hours at a junction temperature of 225 C.

17. The transistor device of claim 16, wherein the transistor device exhibits an associated gain greater than 12 dB at peak PAE.

18. The transistor device of claim 1, wherein the transistor device has a cut-off frequency greater than 20 GHz at a gate voltage of 50V while demonstrating a predicted lifetime greater than 106 hours at a junction temperature of 225 C.

19. The transistor device of claim 18, wherein the transistor device has a cut-off frequency greater than 20 GHz at a gate voltage of 50V while demonstrating output power greater than 9 W/mm, peak PAE greater than 60% and associated gain at peak PAE greater than 12 dB.

20. A transistor device, comprising:
   a semiconductor epitaxial layer structure including a channel layer and a barrier layer on the channel layer, wherein the barrier layer has a higher bandgap than the channel layer;
   a source contact and a drain contact on the barrier layer;
   a first insulating layer on the semiconductor layer between the source contact and the drain contact; and
   a gate contact on the first insulating layer, the gate contact comprising a central portion that extends through the first insulating layer and contacts the barrier layer, and a drain side wing that extends laterally from the central portion of the gate toward the drain contact;
   wherein the transistor device exhibits an output power greater than 9 W/mm at an operating frequency of 10 GHz at a gate voltage of 50V while demonstrating a predicted lifetime greater than $10^6$ hours at a junction temperature of 225 C.

21. The transistor device of claim 20, wherein the transistor device exhibits a peak power added efficiency (PAE) greater than 60% at a gate voltage of 50V while demonstrating a predicted lifetime greater than 106 hours at a junction temperature of 225 C.

22. The transistor device of claim 20, wherein the transistor device exhibits an associated gain greater than 12 dB at peak PAE.

23. The transistor device of claim 20, wherein the transistor device has a cut-off frequency greater than 20 GHz at a gate voltage of 50V while demonstrating a predicted lifetime greater than $10^6$ hours at a junction temperature of 225 C.

24. The transistor device of claim 23, wherein the transistor device has a cut-off frequency greater than 20 GHz at a gate voltage of 50V while demonstrating output power greater than 9 W/mm, peak PAE greater than 60% and associated gain at peak PAE greater than 12 dB.

* * * * *